United States Patent [19]
Kotani et al.

[11] Patent Number: 5,555,527
[45] Date of Patent: Sep. 10, 1996

[54] SEMICONDUCTOR MEMORY, MOVING-PICTURE STORING MEMORY, MOVING-PICTURE STORING APPARATUS, MOVING-PICTURE DISPLAYING APPARATUS, STATIC-PICTURE STORING MEMORY, AND ELECTRONIC NOTEBOOK

[75] Inventors: Hisakazu Kotani, Hyogo; Hironori Akamatsu; Tsutomu Fujita, both of Osaka, all of Japan

[73] Assignee: Matsushita Electric Industrial Co., Ltd., Osaka, Japan

[21] Appl. No.: 358,606

[22] Filed: Dec. 14, 1994

[30] Foreign Application Priority Data

Dec. 15, 1993 [JP] Japan .................................. 5-315456
Jan. 12, 1994 [JP] Japan .................................. 6-001480

[51] Int. Cl.$^6$ .................................................. G11C 13/00
[52] U.S. Cl. ................................... 365/222; 365/189.01
[58] Field of Search ........................................... 365/222

[56] References Cited

U.S. PATENT DOCUMENTS 4,941,127 7/1990 Hashimoto .................... 365/189.01
5,485,429 1/1996 Ono ................................... 365/222

FOREIGN PATENT DOCUMENTS 5-74154 3/1993 Japan .

Primary Examiner—Terrell W. Fears
Attorney, Agent, or Firm—McDermott, Will & Emery

[57] ABSTRACT

A memory array divided into a plurality of sub-memory-arrays is disposed on a chip so that, if a specified sub-memory-array is selected by a sub-memory-array selecting circuit, a normal read/write operation is performed with respect to the sub-memory-array based on an address indicated by a group of external address signals. At the same time, a clock generator for self-refresh mounted on a chip generates a word-line basic clock for self-refresh and a word-line basic clock for refresh, thereby selecting the word lines in the sub-memory-arrays which have not been selected. Prior to a predetermined time at which the sub-memory-array subjected to a refresh operation is subsequently selected, a refresh halt signal is outputted so as to forcibly halt the refresh operation, thereby preventing insufficient recharging of a memory cell. Each of the plurality of sub-memory-arrays stores, of sequential sets of image data, data on one frame or one field.

18 Claims, 27 Drawing Sheets

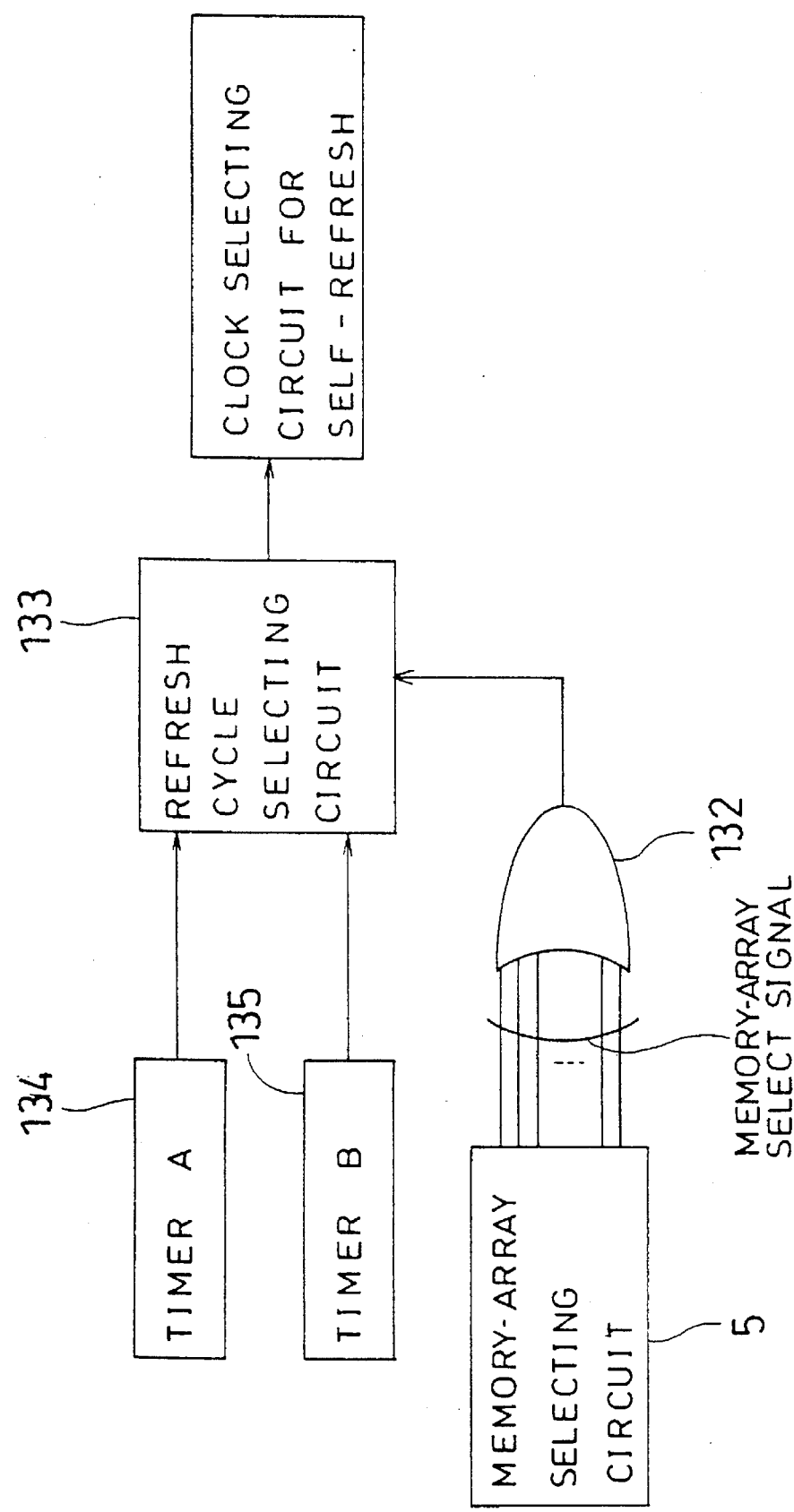

Fig.14 (a) PRIOR ART
IN CASE REFRESH ACCESS DOES NOT COMPETE
WITH NORMAL ACCESS
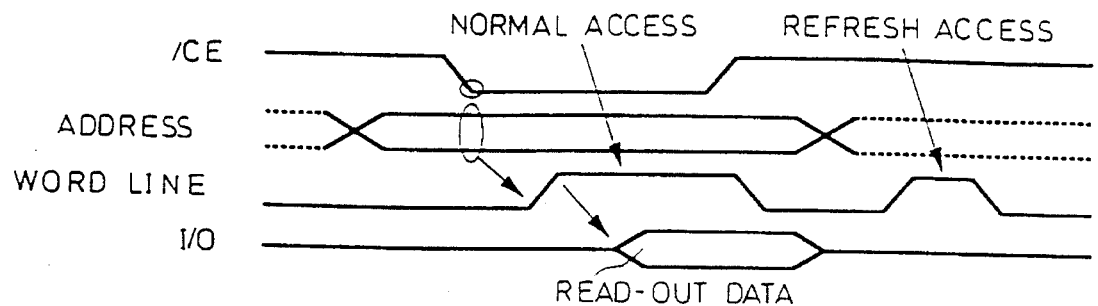
Fig.14 (b) PRIOR ART
IN CASE REFRESH ACCESS COMPETES WITH
NORMAL ACCESS
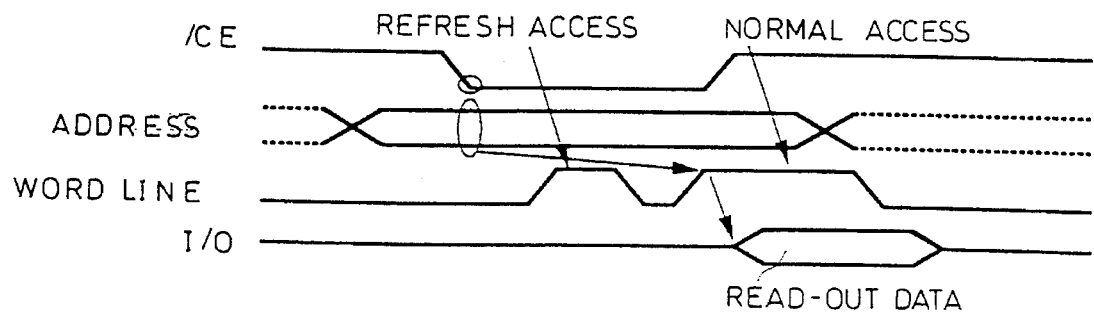

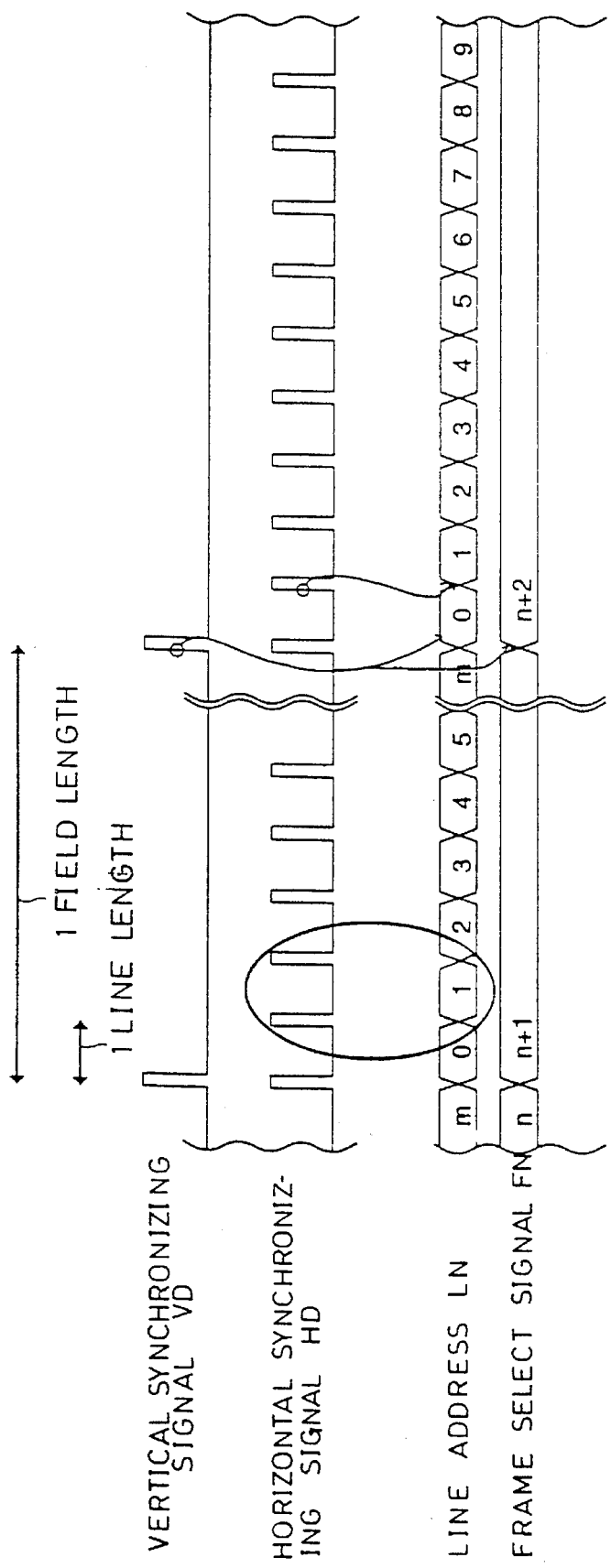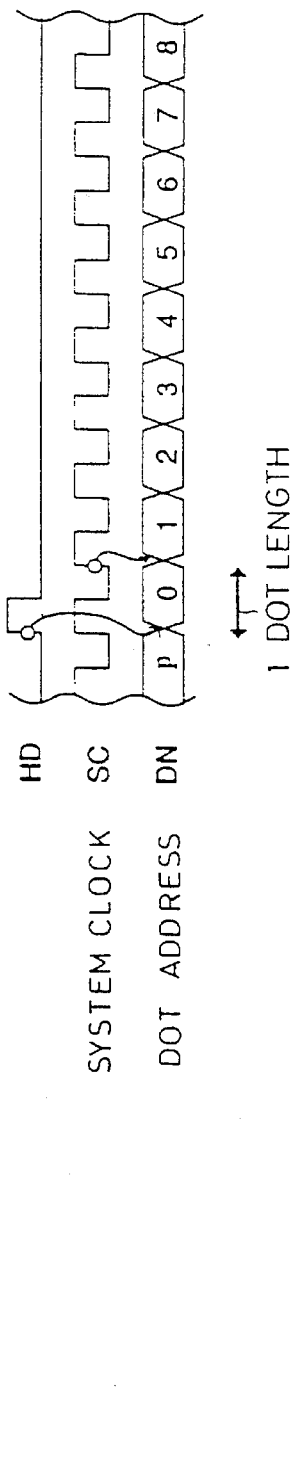

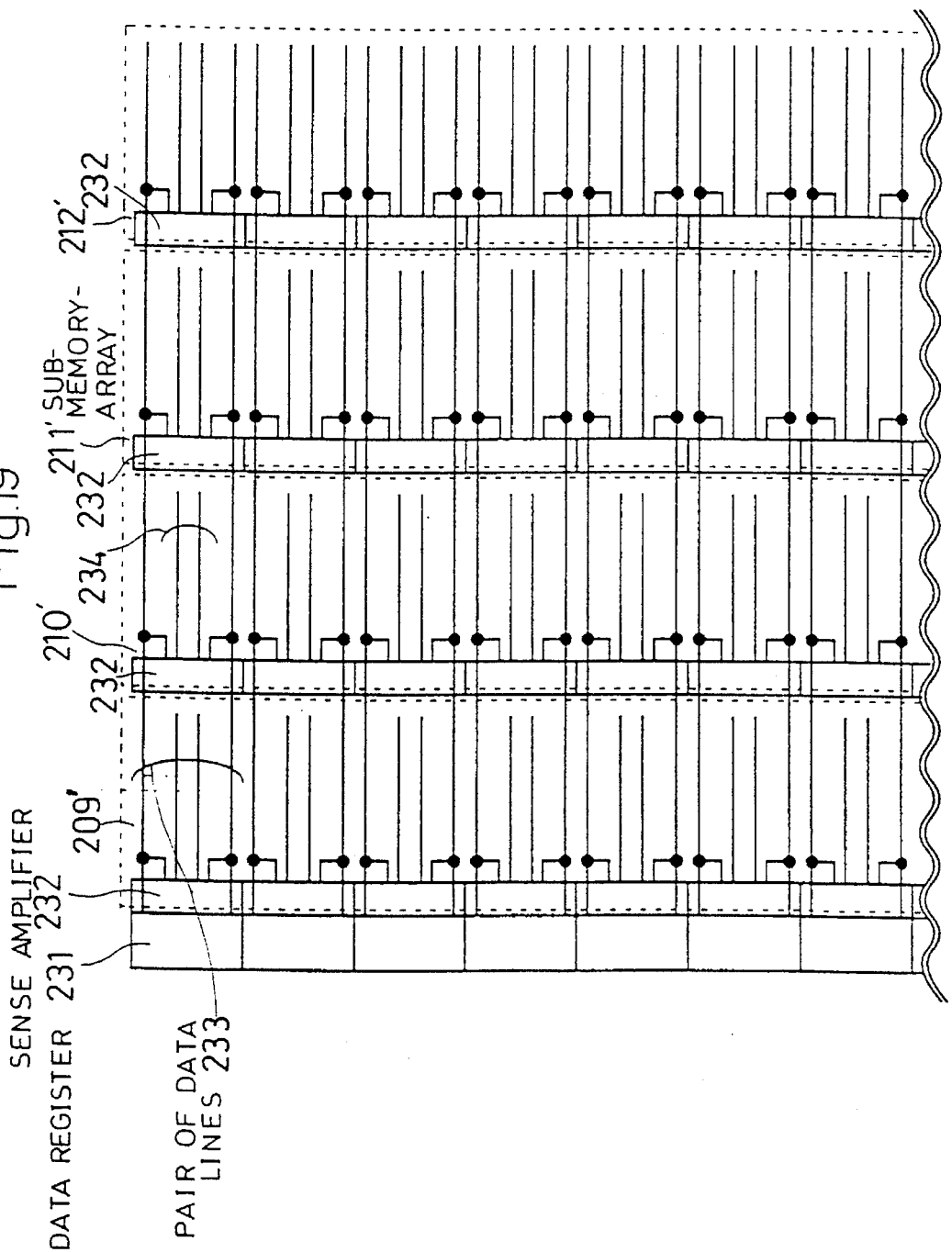

SEMICONDUCTOR MEMORY, MOVING-PICTURE STORING MEMORY, MOVING-PICTURE STORING APPARATUS, MOVING-PICTURE DISPLAYING APPARATUS, STATIC-PICTURE STORING MEMORY, AND ELECTRONIC NOTEBOOK

BACKGROUND OF THE INVENTION

The present invention relates to a semiconductor memory being provided with refresh circuity and to improvements in a semiconductor memory for storing a moving picture or a static picture, in a moving-picture storing memory, in a moving-picture storing apparatus, in a moving-picture displaying apparatus, in a static-picture storing memory, and in an electronic notebook.

in a dynamic RAM (hereinafter referred to as DRAM) which permits the highest integration of all the semiconductor memories, a memory cell serving as a unit for storing information consists of a single transistor and a single capacitor, so that information is stored by charging the above capacitor. However, since tile charge stored on the capacitor leaks off due to its structure, the DRAM requires the refresh operation of periodically recharging the capacitor.

The refresh operation is performed by the following procedures: a word line serving as the gate of the transistor in a memory cell is selected; infinitesimal signals are transferred from all the capacitors connected to the selected word line to bit lines, which are equal in number to the capacitors, and amplified by means of sense amplifiers, which are equal in number to the bit lines; and the capacitors in all the memory cells are recharged. Since a single cycle of operation is complete on a word-line basis, all the word lines are selected periodically so as to activate the sense amplifiers. In general, a refresh operation is performed by interrupting a normal read/write operation. The interruption of the normal operation consequently disables an access to the memory itself, which bringing the system itself into the standby state, so that the operating efficiency of the system is lowered. Moreover, since tile system also executes a command to perform the refresh operation, additional circuits in the system are increased in number, resulting in complicated control.

In the development of DRAMs to which the refresh operation for their memory cells is dispensable as described above, larger capacity as well as higher performance have been pursued in recent years. As for the former pursuit of larger capacity, higher integration has been achieved at the rate of quadrupling the storage capacity of an existing DRAM every three years. With the leading-edge technology, a DRAM having a capacity as large as 256M bits per chip is under development. The latter pursuit of higher performance has been accomplished by implementing a higher-speed and lower-power operation. As for the higher-speed operation, for example, it has been implemented in such a manner that data is inputted and outputted sequentially in synchronization with an external clock by specifying only the leading address (hereinafter referred to as serial access), not in a conventional manner which assumes completely random addressing. A frequency as high as about 100 MHz has been required as the frequency of a clock, while a DRAM which satisfies the above requirement has been appearing on the market. On the other hand, the application of DRAMs which enables a serial high-speed access to data, not random, has been in great demand in the field of image-related devices.

As an image memory for use in these image-related devices, a field memory has conventionally been manufactured for a is commercial purpose. The leading-edge field memory, which has a capacity of 4M bits per chip, operates at a frequency of 50 to 100 MHz. Since all the word lines are sequentially selected in the image memory, it follows that a refresh operation is performed equivalently. In the case of operating a 4M bit DRAM of 8-bit parallel type at 50 MHz, only 10 milliseconds is substantially required to read out the whole 4M bits, though the spec of the refresh cycle is 16 milliseconds, so that it will be appreciated that the refresh operation is not necessary.

Although it is highly predictable that a chip having a capacity of 256M bits and operating at 100 MHz will be in future demand for storing images or the like, if the whole 256M bits are to be read out with an input/output unit of 16-bit parallel type, for example, an operation at 100 MHz requires about 168 milliseconds. Since DRAMs require periodical refreshing, as described above, and the supposed spec of the refresh cycle for the 256M-bit DRAM is about 128 milliseconds, it is necessary to perform a refresh operation by interrupting a serial-access operation, which may interfere with tile high-speed operation of the system with faster cycle time.

The foregoing statement is summarized in the following table which shows the capacities, refresh periods, and time required to access all the bits of DRAMs in individual generations. Since the data transfer rate for high-definition television (HDTV) is 1. 2 G bits/second, it is assumed that the operating frequency of each DRAM is 80 MHz and its input/output unit is of 16-bit parallel type.

TABLE 1

| CAPACITY | REFRESH PERIOD | TIME REQUIRED FOR FULL-BIT ACCESS |
|---|---|---|
| 1 M | 8 ms | 0.82 ms |
| 4 M | 16 ms | 3.28 ms |
| 16 M | 32 ms | 13.1 ms |
| 64 M | 64 ms | 52.4 ms |
| 256 M | 128 ms | 209.7 ms |

As can be seen from the foregoing table, if all the bits in a serial memory having a capacity on the order of 1M to 64M bits are sequentially accessed, it means that a refresh operation is performed equivalently. With a memory having a larger capacity on the order of 256M bits, however, the refresh operation is required even in a serial access memory as well as in a random access memory, so that the operating efficiency of the system is lowered due to the refresh operation.

To overcome the above problem, there has conventionally been used a virtual SRAM ( see, for example, 1987 IEEE International Solid-State Circuits Conference Digest of Technical Papers, pp.20–21, February 1987 or Nikkei Electronics, pp.167–184, Apr. 6, 1987). The virtual SRAM is constituted so that a refresh signal is generated therein in order to perform a refresh operation, while the normal operation is brought into the standby state. That is, although the refresh operation is not seemingly performed in the virtual SRAM when viewed from the outside, a refresh operation is performed automatically under the internal control of the virtual SRAM (hereinafter referred to as self-refresh). If a normal access from the outside competes with a self-refresh access, the refresh access is preferentially enabled, while the normal access is brought into the standby state, as shown in the timing chart of FIG. 14(a). Initially, a word line is activated so as to perform a self-refresh operation, followed by the selection of another word line in accordance with a normal-access enable signal/CE and with an external address, so that data is read out and appears at an input/output port I/O. However, since the above conventional virtual SRAM is constituted so that the normal access is enabled after the refresh access was preferentially enabled, the access time for a word line is disadvantageously increased (hereinafter referred to as word-line delay). As a result, if the refresh access competes with the normal access, the time elapsed till the read-out data appears is increased, as shown in FIGS. 14(a) and 14(b), so that the cycle time of the virtual SRAM is disadvantageously increased because the minimum cycle time of the virtual SRAM is equal to the sum of the cycle time of the normal access and the cycle time of the self-refresh.

Below, a specific description will be given to adverse effects caused by the word-line delay. Since it is often the case with a serial access memory that a single chip is operated both at a high frequency and at a low frequency, the description will be given to the case where the operation is alternately performed at, e.g., higher-rate 100 MHz and at lower-rate 10 MHz. Since the access time for a DRAM (including time required to access a word line) is about 60 ns, data is outputted 6 clocks after the initiation of the access to the memory in the case of operating at 100 MHz. With the virtual SRAM, however, the amount of word-line delay is generally about 30 ns, so that the access time is increased by about 30 ns for the word-line delay, thus outputting data 9 clocks after the initiation of the access in the case of operating at 10 MHz, on the other hand, since it is necessary to use the same clock timing as used in the case of operating at 100 MHz described above, it becomes necessary to output data in 600 ns (=100 ns×6 clocks) without the word-line delay and in 900 ns (=100 ns×9 clocks) with the word-line delay. Consequently, if the amount of word-line delay is large, it becomes necessary to provide an additional circuit for delaying data inside the chip as well as an additional circuit for delaying the timing of fetching data outside the chip, each of which is not required there is no word-line delay. Although the amount of delay in the case of operating at 100 MHz is 3 clocks in the above description, it reaches 15 clocks in the case of operating at 500 MHz, so that the above problem becomes more conspicuous as the operating frequency becomes higher.

Meanwhile, a large-capacity DRAM has been regarded as a promising semiconductor memory for storing a moving picture, since the moving picture entails an extremely large amount of data and a high data transfer rate.

In view of the foregoing, a DRAM exclusively for storing images with a capacity of about 256K bits has conventionally been developed in order to process a digital signal. Such a DRAM is introduced in, for example, Ishimoto et al., "A Screen Size Serial Access Memory for Video Applications," 10th European Solid-State Circuits Conference, pp.149–152, (September 1984) and in Kotani et al., "A 50 MHz 8 Mb Video RAM with a Column Direction Drive Sense Amplifier," 1989 Symposium on VLSI circuits, 8–4, pp.105–106, (May 1989).

FIG. 27 is a schematic view of a conventional semiconductor memory, in which a reference numeral 215 designates a system clock, 216 designates a write control signal, 290 designates a data input/output unit for receiving external data or outputting internal data to the outside in accordance with the system clock 215 and with the write control signal mentioned above, and 296 designates a memory cell array which is connected to the above data input/output unit 290 via a data register 295. The data register 295 performs serial-to-parallel conversion or parallel-to-serial conversion with respect to data.

A reference numeral 292 designates an external address bus, 297 designates a/CAS signal, 298 designates a/RAS signal, and 294 designates an address input unit for receiving an external address from the above external address bus 292. Inside the address input unit are provided a column-address input element 299 and a row-address input element 291. The above column-address input element 299 predecodes the inputted external address in accordance with the system clock 216 and with the /CAS signal 297. The row-address input element 291 predecodes the inputted external address in accordance with the /RAS signal 298 and outputs the predecoded address to the memory cell array 296 via the internal address bus 293.

The data in the data input/output unit 290 is converted to parallel data by the data register 295 and then inputted to the memory cell array 296. On the other hand, the data on the external address bus 292 is inputted to the address input unit 294 and predecoded by the row-address input element 291 and column-address input element 299 inside the address input unit 294, so as to be transmitted to the memory array 296 via the internal address bus 293. The memory cell array 296 stores the above inputted data at one address after another in the order in which it is selected by the above address bus 293.

However, since each of the above conventional semiconductor memory chips is small in capacity, it can store data only on a static picture (1 field, 1 frame). Consequently, with a simple combination of the chip structure and large capacity, only a static picture (1 field, 1 frame) with an extremely large amount of data can be stored. Although a moving picture can be considered as a sequence or static pictures, since the conventional technology does not permit a distinction between moving pictures and static pictures, it is difficult to constitute a DRAM for storing moving and static pictures, which are often treated in images.

To eliminate the above disadvantage, there can be considered the provision of a storing means for counting the number of inputted row addresses till it reaches a specified value sufficient to form one image and storing the row address at the time when the number of inputted row addresses reached the specified value. However, such a structure is intricate and is substantially incompatible with a moving picture or static picture entailing a large number of images.

SUMMARY OF THE INVENTION

A first object of the present invention is to provide a high-speed and large-capacity serial-access semiconductor memory composed of a large-capacity DRAM wherein word-line delay is not caused and which does not require refresh control from the outside.

A second object of the present invention is to provide: a moving-picture storing memory which permits a distinction between individual images and which is optimumly constituted for storing a large number of moving pictures and static pictures; a moving-picture storing apparatus and a moving-picture displaying apparatus each using the moving-picture storing memory; a static-picture storing memory; and an electronic notebook using the static-picture storing memory.

To attain the above first object, the semiconductor memory according to the present invention is composed of a large-capacity DRAM which is basically constituted so that a memory array is divided into a plurality of sub-memory-arrays and that, when a normal read/write operation is performed with respect to any one sub-memory-array of the divided memory array, a refresh operation is performed simultaneously and asynchronously with respect to the other sub-memory-arrays. In this case, if two sub-memory-arrays are sequentially subjected to the normal read/write operation, there is a possibility that the sub-memory-array subsequently processed is subjected to the normal read/write operation, while the normal read/write operation with respect to the sub-memory-array currently processed is not completed yet (specifically, in the case of amplifying a large number of bit lines connected to each word line, while amplifying operation with respect to the bit lines connected to any one word line is not completed yet). To prevent such insufficient amplification, measures are taken to initiate the normal read/write operation at an appropriate stage after the amplifying operation was sufficiently performed with respect to the bit lines connected to one word line. Since it is possible in serial access to predict the time at which the normal read/write operation with respect to one sub-memory-array is completed by counting the number of clocks, if the amplifying operation with respect to the bit lines connected to the subsequent word line is disenabled in advance at a time point immediately before the completion of the normal read/write operation currently performed, that is, several clock before counting up, insufficient amplification of signals on the bit lines connected to the subsequent word line (insufficient refresh operation) can be prevented.

To attain the above second object, the present invention is constituted so that a memory cell array is divided into a plurality of sub-memory-arrays each of which has a sufficient capacity to store image data on one image.

Accordingly, a specific structure of the semiconductor memory of the present invention is a semiconductor memory to which data can be sequentially inputted/outputted in synchronization with an external clock and which comprises: a plurality of memory arrays disposed on a chip; a memory-array selecting circuit for selecting, in accordance with a group of addresses inputted from the outside, at least one memory array out of the above plurality of memory arrays; refresh-signal generating means for generating a refresh address and a word-line basic clock for refresh; and address-selecting circuits which are equal in number to the above memory arrays so as to correspond to the above respective memory arrays. Each of the above address-selecting circuits is constituted so that it selects, when the corresponding memory array is selected by the above memory-array selecting circuit, a word line in the above selected memory array in accordance with the group of addresses inputted from the outside and with a word-line basic clock, while it selects, when the corresponding memory array is not selected by the above memory-array selecting circuit, word lines in the above memory arrays which have not been selected in accordance with the refresh address and word-line basic clock for refresh generated by the above refresh-signal generating means. The above semiconductor memory further comprises: a pre-switching-time predicting circuit for predicting a time point immediately before a predetermined time at which each of the memory arrays is switched from the unselected state to the selected state by the above memory-array selecting circuit; and a refresh inhibit circuit for inhibiting the above refresh-signal generating means from generating the word-line basic clock for refresh at the time point immediately before the predetermined time which was predicted by the above pre-switching-time predicting circuit.

In addition to the above structure, the semiconductor memory of the present invention comprises: an access-completion detecting circuit for detecting the completion of access to data on one word line in the memory array selected by the memory-array selecting circuit; a normal-operation-halt control circuit for halting the selection of the memory array by the above memory-array selecting circuit from the time at which the above access-completion detecting circuit detected the completion of the access on, so that the address-selecting circuit selects a word line in the above memory array in accordance with the refresh address of the refresh-signal generating means; and a cycle setting circuit for setting, when the above normal-operation-halt control circuit halted the selection of the memory array, a shorter increment cycle for the refresh address of the above refresh-signal generating means.

In addition to the above structure, the semiconductor memory of the present invention further comprises a delay circuit for generating a delayed word-line basic clock for refresh by delaying the word-line basic clock for refresh generated by the refresh-signal generating means by a predetermined period within the increment cycle for the refresh address generated by the above refresh-signal generating means, wherein the word-line basic clock for refresh generated by the above refresh-signal generating means and the delayed word-line basic clock for refresh generated by the above delay circuit are inputted to the address-selecting circuits corresponding to the plurality of memory arrays which have not been selected by the memory-array selecting circuit and the operation of activating and inactivating the word lines for refreshing the plurality of memory arrays which have not been selected by the above memory-array selecting circuit is performed at different times for different memory arrays.

In addition to the above structure, the semiconductor memory of the present invention comprises a selection detecting circuit for detecting the presence or absence of a memory array selected by the memory-array selecting circuit, wherein the timing period of the timer circuit is set to a predetermined period when the above selection detecting circuit detected the state in which none of the memory arrays had been selected, while the timing period of the timer circuit is set to a period shorter than the above predetermined period when the above selection detecting circuit detected the state in which any of the memory arrays had been selected.

The moving-picture storing memory of the present invention comprises: a plurality of sub-memory-arrays formed by dividing a memory array into a plurality of sections, each for storing, of sequential sets of image data, data on one image; data input/output means for inputting and outputting data to and from each of the above sub-memory-arrays; and sub-memory-array selecting means for selecting any one of the above plurality of sub-memory-arrays. Here, one image indicates both one field and one frame (=two fields) when it is interlaced.

The static-picture scoring memory comprises: a plurality of sub-memory-arrays formed by dividing a memory array into a plurality of sections, each for storing one of a plurality of sets of data on a static picture forming one image; data input/output means for inputting and outputting data to and from each of the above sub-memory-arrays; and a sub-memory-array selecting means for selecting any one of the above plurality of sub-memory-arrays.

Moreover, the semiconductor memory of the present invention adopts a structure obtained by combining the above basic structure of the semiconductor memory with the structure of the above moving-picture storing memory or static-picture storing memory.

The moving-picture displaying apparatus of the present invention comprises: a moving-picture storing memory with the above structure; and a tuner, wherein a signal obtained by subjecting the output signal from the above tuner to analog-to-digital (A/D) conversion is inputted to and stored in the above moving-picture storing memory, the above moving-picture displaying apparatus further comprising: a monitor for displaying a moving picture; and a switching means for switching the input to the above monitor to the output signal from the above tuner and to a signal obtained by subjecting the output from the above moving-picture storing memory to digital-to-analog (D/A) conversion.

The electronic notebook of the present invention comprises: a static-picture storing memory with the above structure; and a display screen to which data is inputted by means of an input pen, wherein data on one image displayed on the above display screen is stored in the above static-picture storing memory.

With the above structure, in the memory array selected by the memory-array selecting circuit in the semiconductor memory of the present invention, the corresponding address selecting circuit selects a word line in accordance with the group of external addresses and with the word-line basic clock, thereby performing the normal read/write operation. Meanwhile, in the memory arrays which have not been selected by the memory-array selecting circuit, the corresponding address selecting circuits select word lines in accordance with the refresh address of the refresh-signal generator and with the word-line basic clock for refresh, thereby performing the refresh operation.

In terms of one memory array, there is a case where it is selected by the memory-array selecting circuit in the course of the refresh operation, so that the refresh operation is switched to the normal read/write operation. In this case, a predetermined time prior to switching is predicted by the pre-switching-time predicting circuit, so that the generation of the refresh address and word-line basic clock by the refresh-signal generator is inhibited by the refresh inhibit circuit during the period between the predetermined time prior to switching and switching, thus inhibiting the refresh operation. Consequently, it becomes possible to prevent the halting of the refresh operation before it is completed, i.e., switching from the refresh operation to the normal read/write operation at a stage at which the amplification of signals on the bit lines is insufficient and the rewriting of data in the memory cell is insufficient, so that the destruction of data in the memory cell can surely be prevented.

Since the normal read/write operation is performed in the selected memory array at the same time that the refresh operation is performed in the other unselected memory arrays, the normal operation does not compete with the refresh operation in terms of one memory, so that the conventional word-line delay does not occur.

Moreover, since the refresh operation is performed in an asynchronous system in which the refresh address is generated inside independently of the external address, the refresh operation can be performed automatically even in the standby state in which the inputting of the external address is halted, as opposed to the synchronous system in which the refresh operation is performed in synchronization with the external address. In the case where the operating frequency is varied accordance with various modes, the disadvantage that the refresh cycle becomes longer than the required one can be avoided.

Moreover, in the semiconductor memory of the present invention, even in the memory array selected by the memory-array selecting circuit, if the operating frequency is low, it becomes necessary to perform the refresh operation in the course of the normal read/write operation. In this case, when access to data on one word line was completed and the access-completion detecting circuit detected the completion, the normal-operation-halt control circuit halts the normal read/write operation and, instead, another word line is selected based on the refresh address having a shorter increment cycle, so that a refresh operation is performed.

Furthermore, in the semiconductor memory of the present invention, during the refresh operation in the plurality of unselected memory arrays, the delayed word-line basic clocks for refresh provided with different delay times are inputted to the respective address selecting circuits of the unselected memory arrays, so that the refresh operation is performed for each of the unselected memory arrays at different times. Consequently, it becomes possible to reduce the peak current resulting from the concurrent refresh operation performed with respect to the plurality of unselected memory arrays in the activation of the memory cell and the peak current in the resetting of the refresh operation. As a result, a variation in power-source voltage is reduced, thereby effectively preventing a malfunction during the normal read/write operation which is concurrently performed in the selected memory array.

In addition, in the semiconductor memory of the present invention, the presence or absence of a memory array selected by the memory-array selecting circuit has been detected by the selection detecting circuit. In the case where no memory cell has been selected, the refresh cycle is set comparatively long. In the case where any memory array has been selected, on the other hand, the refresh cycle is set comparatively short. Consequently, in the normal read/write operation as a result of the selection of any memory array, the potential of the substrate and semiconductor temperature change during the operation, which tends to deteriorate the pause-time characteristic of the memory cell, so that it becomes possible to perform the refresh operation in a shorter cycle. In this case, the refresh operation can be performed in a comparatively short refresh cycle. In the standby state in which the normal read/write operation is not performed in any memory array, on the other hand, the normal pause-time characteristic is sustained, so that the refresh operation is performed in a comparatively long refresh cycle, thereby preventing an unnecessary increase in the current for holding data due to the refresh operation in a short cycle.

In the semiconductor memory, moving-picture storing memory, static-picture storing memory, and electronic notebook of the present invention, since each image of a moving picture or static picture is stored in one sub-memory-array, the images of the moving-picture or static picture can easily be distinguished from each other, so that an optimum structure for storing a moving picture or static picture can be implemented.

Moreover, in the moving-picture storing apparatus of the present invention, the output signal of the tuner (image signal) is inputted to the monitor and to the moving-picture storing memory so that it is stored in the moving-picture storing memory as soon as a moving picture is displayed on the monitor. Consequently, if information displayed on the monitor, such as a destination address for postcards or a recipe in a cooking program, is erased from the monitor in a short period of time, a switching means is operated immediately in order to read out the information stored in the moving-picture storing memory, so that the required information erased from the above monitor can be displayed on the monitor again to be checked.

The above objects and novel features of the present invention will be more apparent from the reading of the following description in conjunction with the accompanying drawings.

BRIEF DESCRIPTION OF THE DRAWINGS

The accompanying drawings show the preferred embodiments of the present invention.

In the drawings:

FIG. 13 is a block diagram showing the structure of a fourth embodiment according to the present invention;

FIG. 14(a) is a view showing the timing chart of a conventional refreshing system in the case where normal access does not compete with refresh access;

FIG. 14(b) is a view showing the timing chart of the conventional refresh system in the case where the normal access competes with the refresh access;

FIG. 18(a) is a timing chart of circuit operation in the fifth embodiment of the present invention;

FIG. 18(b) is a timing chart showing an enlarged principal portion of FIG. 18(a);

FIG. 19 is a view schematically showing the structure of a principal portion of the moving-picture storing memory in a sixth embodiment of the present invention;

DETAILED DESCRIPTION OF THE PREFERRED EMBODIMENTS

Below, the preferred embodiments of the present invention will be described with reference to the accompanying drawings.

FIRST EMBODIMENT

Figure 1:
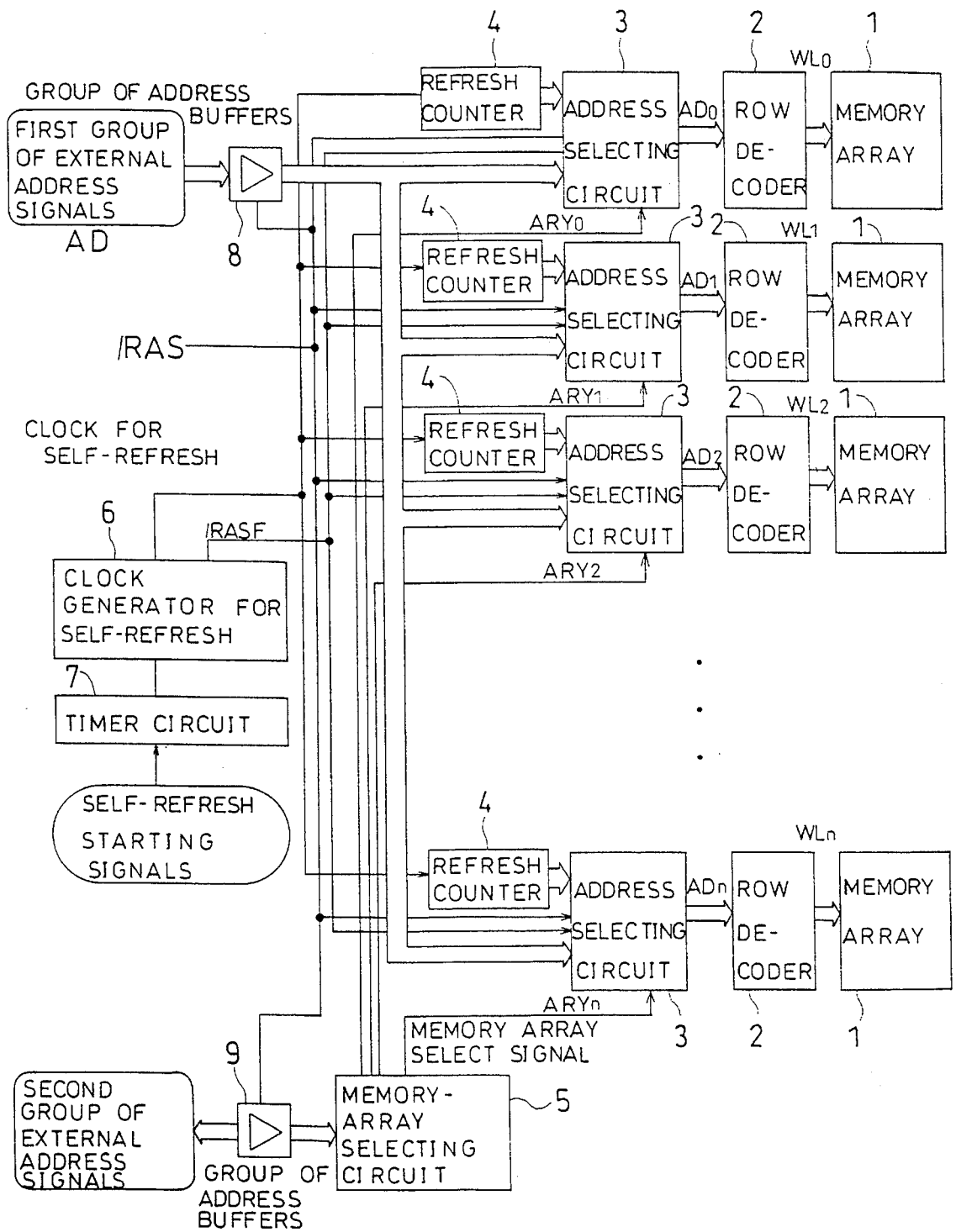
FIG. 1 is a block diagram showing the structure of a basic portion of a first embodiment according to the present invention.

FIG. 1 is a block diagram showing the basic structure of a first embodiment according to the present invention. In the drawing, a reference numeral 1 designates a plurality of memory arrays, each consisting of a plurality of memory cells. Each of the memory arrays 1 is obtained by dividing a single memory array in accordance with a signal for one field that has been interlaced or with a signal for one frame that has been non-interlaced, serving as a signal indicating a moving or static picture for one image displayed on the display screen of a monitor such as a television receiver.

A reference numeral 2 designates row decoders for selecting a word line in the corresponding memory array and 3 designates address-selecting circuits provided corresponding to the memory arrays.

A reference numeral 4 designates refresh counters which are equal in number to the memory arrays 1. A reference numeral 5 designates a memory-array selecting circuit for selecting desired one or more arrays out of the above plurality of memory arrays 1, 6 designates a clock generator for self-refresh for generating a clock for self-refresh which increments the refresh counters, 7 designates a timer circuit for determining the self-refresh cycle, 8 designates a first group of address buffers for a first group of addresses inputted from the outside, and 9 designates a second group of address buffers for a second group of addresses inputted from the outside.

The selection of one or more memory arrays 1 is accomplished by: inputting the second group of addresses from the outside via the group of address buffers 9 into the chip so that they are transferred to the memory-array selecting circuit 5; generating memory array select signals which are equal in number to the memory arrays 1 through a normal decoding operation in the memory-array selecting circuit 5; and transferring the memory array select signals to the corresponding memory arrays 1.

In each of the memory arrays 1 are disposed the above row decoder 2 for selecting a word line, address-selecting circuit 3, and refresh counter 4 correspondingly.

Each of the above address-selecting circuits 3 selects, when the memory array select signal has been activated, a combination of the outputs from the group of address buffers 8 and the output from the word-line basic clock /RAS and selects, when the memory array select signal has not been activated, a combination of the output from the refresh counter 4 and the output from a word-line clock for refresh /RASF.

The above word-line basic clock /RAS is inputted from the outside, while the word-line basic clock for refresh /RASF is generated from the clock generator for self-refresh 6. Each of the /RAS and /RASF is a clock for fetching an address for selecting a word line, resetting, equalizing bit lines, and precharging. The cycle of the word-line basic clock for refresh /RASF is longer than the cycle of the word-line basic clock /RAS. As shown in FIG. 1, the first and second groups of addresses inputted from the outside are fetched in response to the /RAS.

The timer circuit 7 is activated by a self-refresh starting signal. The timer circuit 7 determines the cycle time of the refresh operation and the clock generator for self-refresh 6 generates the word-line basic clock for self refresh in response to a signal from the timer circuit 7. The word-line basic clock for self-refresh is transferred to each of the refresh counters 4. Each of the refresh counters 4 generates a refresh address, which is incremented in synchronization with the word-line basic clock for self-refresh.

A means for generating the self-refresh starting signal can be preliminarily activated in a bonding option or the like so that it is constantly in the refresh starting state.

The above timer circuit 7, clock generator for self-refresh 6, and plurality of refresh counters 4 constitute a refresh-signal generator for generating a refresh address and the word-line basic clock for refresh.

In the present embodiment, a normal read/write operation is performed with respect to the memory array 1 in which the memory array select signal has been activated. The address inputted from the outside selects the word line in the memory array 1 selected via the group of address buffers 8, address-selecting circuit 3, and row decoder 2. On the other hand, the memory arrays 1 in the standby state in which the normal read/write operation is not performed, the address in the refresh counter 4 generated inside the chip selects word lines in the unselected memory arrays via the address-selecting circuit 3 and row decoder 2, thereby performing the refresh operation.

The above operation will be described with reference to the timing chart of FIG. 2(a).

In the drawing, /RAS indicates the word-line basic clock, AD indicates an address inputted from the outside, which corresponds to the first group off addresses in FIG. 1, /RASF indicates the word-line basic clock for refresh, ARY0, ARY1, ARY2, . . . , and ARYn indicate memory array select signals, and AD0, AD1, . . . , and and indicate addresses inputted to the row decoder 2 inside the memory array, which correspond to the memory array select signals ANY0, ARY1, ARY2, . . . , and ARYn, respectively. Likewise, WL1, WL2, . . . , and WLn indicate word lines inside the memory arrays which correspond to the memory array select signals ARY0, ARY1, ARY2, . . . , and ARYn, respectively.

Figure 2A:
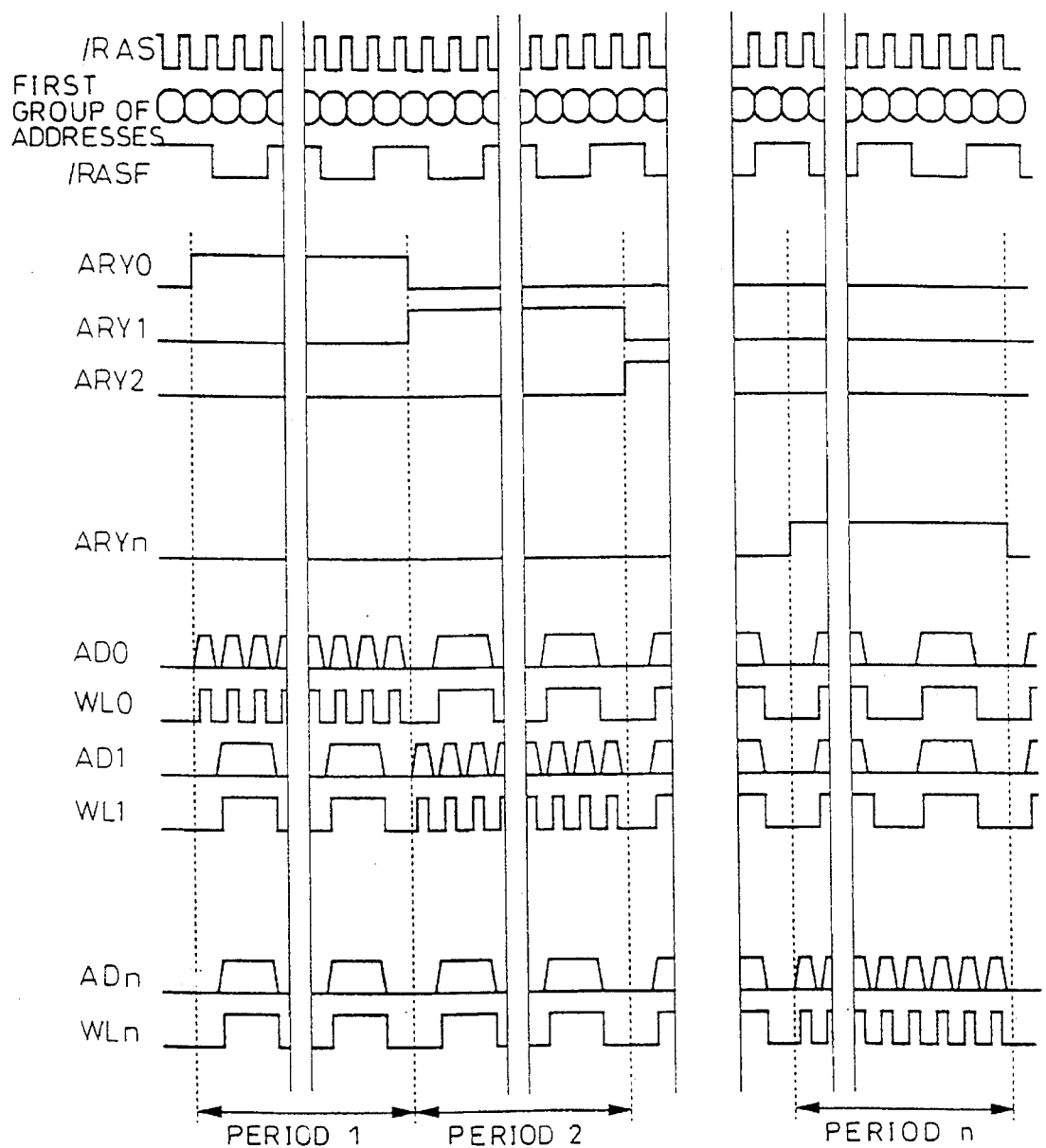
FIG. 2(a) is a view showing the timing chart of the basic portion of the first embodiment according to the present invention.

As can be seen from FIG. 2(a), a word line is selected under the control from the outside when the memory array select signal is activated, while a word line is selected under the self-refresh control when the memory array select signal is not activated. If attention is given to the period 2 in FIG. 2(a), e.g., the memory array select signal ARY1 is activated so that the word line WL1 in the memory array 1 which corresponds to the activated memory array select signal ARY1 is selected in synchronization with the external clock /RAS, while the word lines WL0 and WL2 in the unselected memory arrays which correspond to the other memory array select signals ARY0, ARY2, . . . , and ARYn, respectively, are selected in accordance with the word-line basic clock for refresh /RASF.

Figure 2B:
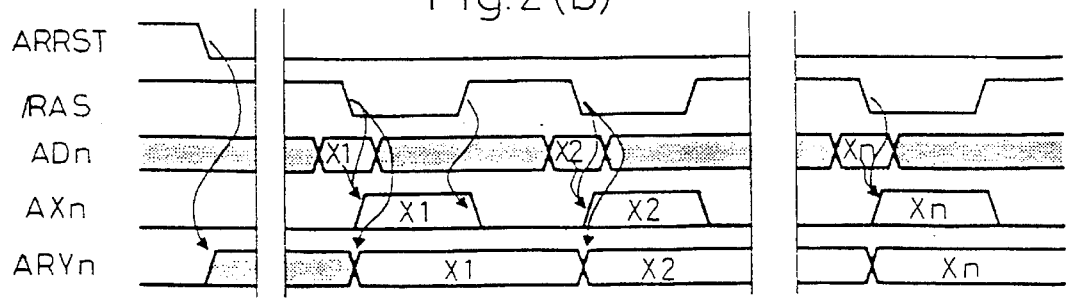
FIG. 2(b) is a view showing the relationship between a word-line basic clock and addresses in the first embodiment of the present invention.

FIG. 2(b) shows the relationship between the above word-line basic clock /RAS and addresses. In the drawing, and indicates the address inputted from the outside, AXn indicates the internal address for selecting a word line in a memory array, and ARYn indicates the memory array select signal. The fetching of the internal address AXn and the resetting thereof are timed with the /RAS, similarly to a normal DRAM. As for the memory array select signal ARYn, the address is fetched on the falling edge of the /RAS and held till the next falling edge of the /RAS. The memory array select signal ARYn is reset by a dedicated reset signal ARRST. The dedicated reset signal ARRST may be an external input or generated inside.

In the present embodiment, the normal read/write operation is performed by selecting the word line WL1 in the memory array 1 selected in the manner described above in synchronization with the external clock /RAS, while selecting the word lines WL0 and WL2 in the unselected memory arrays in accordance with the word-line basic clock for self-refresh /RASF, thereby performing the self-refresh operation. Consequently, the normal access does not compete with the refresh access in each of the memory arrays 1, so that the word-line delay does not occur. Therefore, a high-speed serial access can be performed without controlling a refresh operation from the outside.

Next, the characteristics of the present invention will be described.

Figure 3:
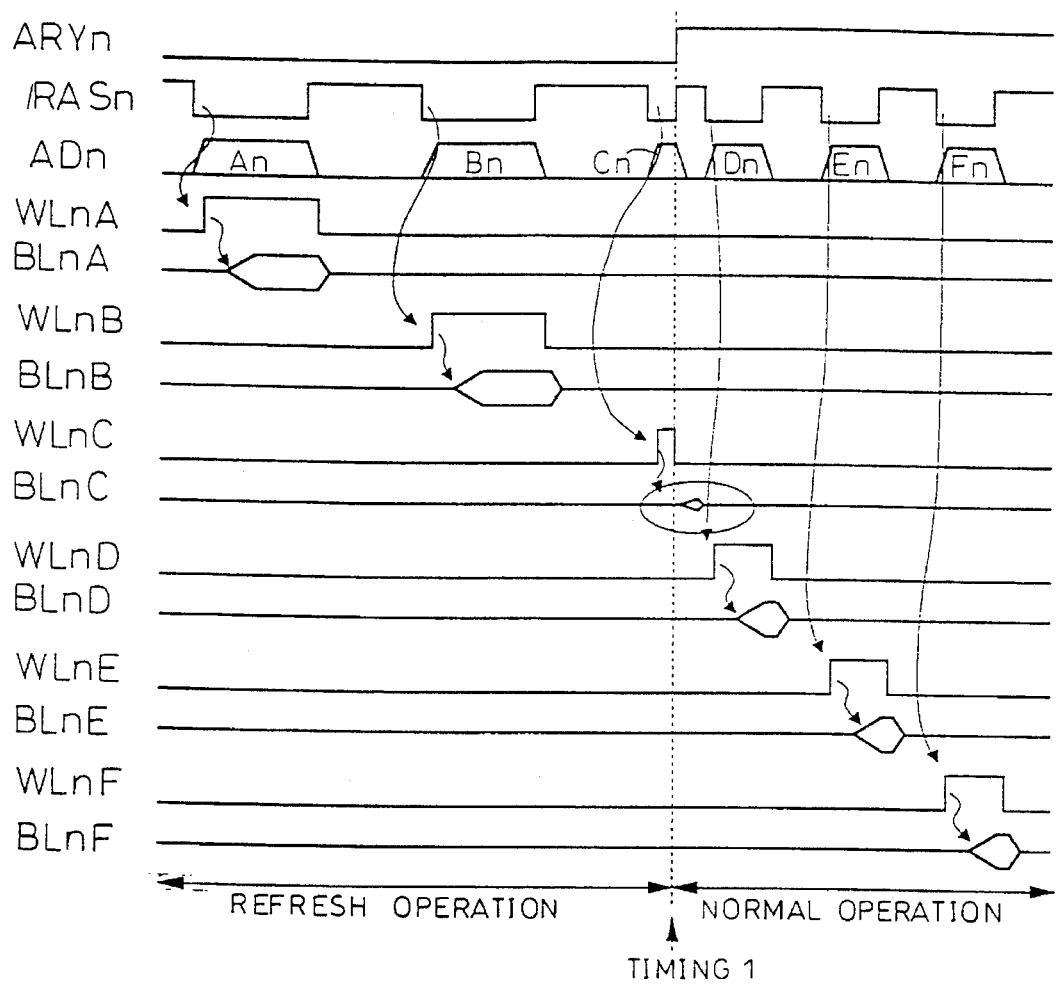
FIG. 3 is a view illustrating the case where a memory array is selected in the course of refresh operation.

First, as shown in FIG. 3, a description will be given to the timing with which the memory array select signal ARYn makes a transition from the unselected state to the selected state. In the drawing, /RASn indicates the word-line basic clock in the memory array corresponding to the memory array select signal ARYn, while and, WLnA to WLnF, and BLnA to BLnF indicate the address signal, word lines, and bit lines, respectively, in the memory array corresponding to the memory array select signal ARYn. As described above, the refresh operation is performed when the memory array select signal ARYn is at the Low level, while the normal operation is performed when the memory array select signal ARYn is at the High level. The operations are performed asynchronously with each other.

Figure 8:
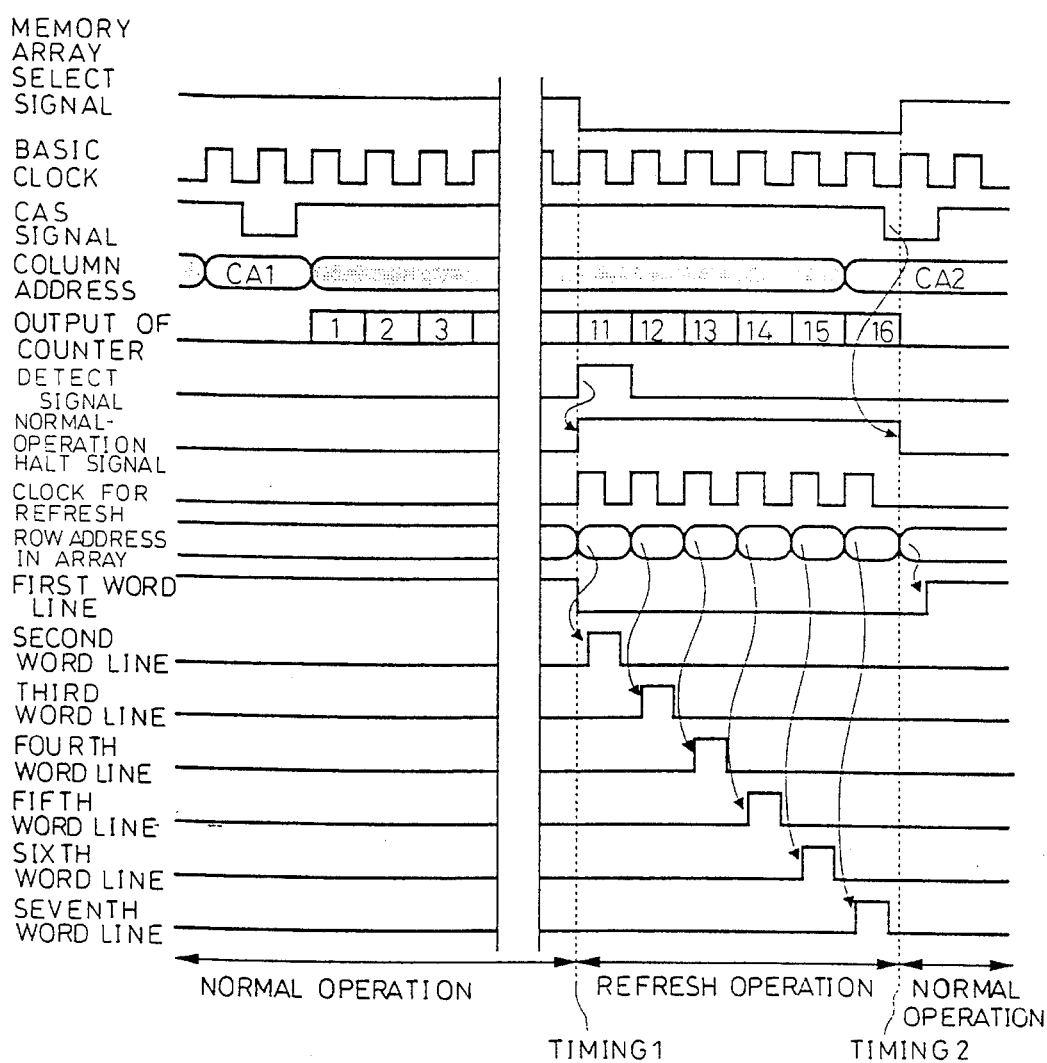
FIG. 8 is a view showing the timing chart of the second embodiment according to the present invention.

The timing 1 of FIG. 8 falls on the time at which the refresh operation is switched to the normal operation. When the word-line basic clock /RASn falls immediately before the timing 1 and the address ADn specifies the refresh address Cn, the word line WLnC rises so that data on the bit line BLnC is amplified accordingly. However, as shown in FIG. 3, the memory array select signal ARYn is switched from the Low level to the High level before the amplifying operation is completed, so that the refresh operation is switched to the normal read/write operation. As a result, the word line WLnD is selected and then the word lines WLnE and WLnF are selected sequentially. That is, since the amplification of data on the bit line BLnC in the refresh operation is insufficient as shown in FIG. 3 by the oval figure, the rewriting of data in a memory cell is performed only insufficiently, which disenables the refresh operation in a memory cell connected to the word line WLnC. There is also a possibility that data in the memory cell is destroyed.

Figure 4:
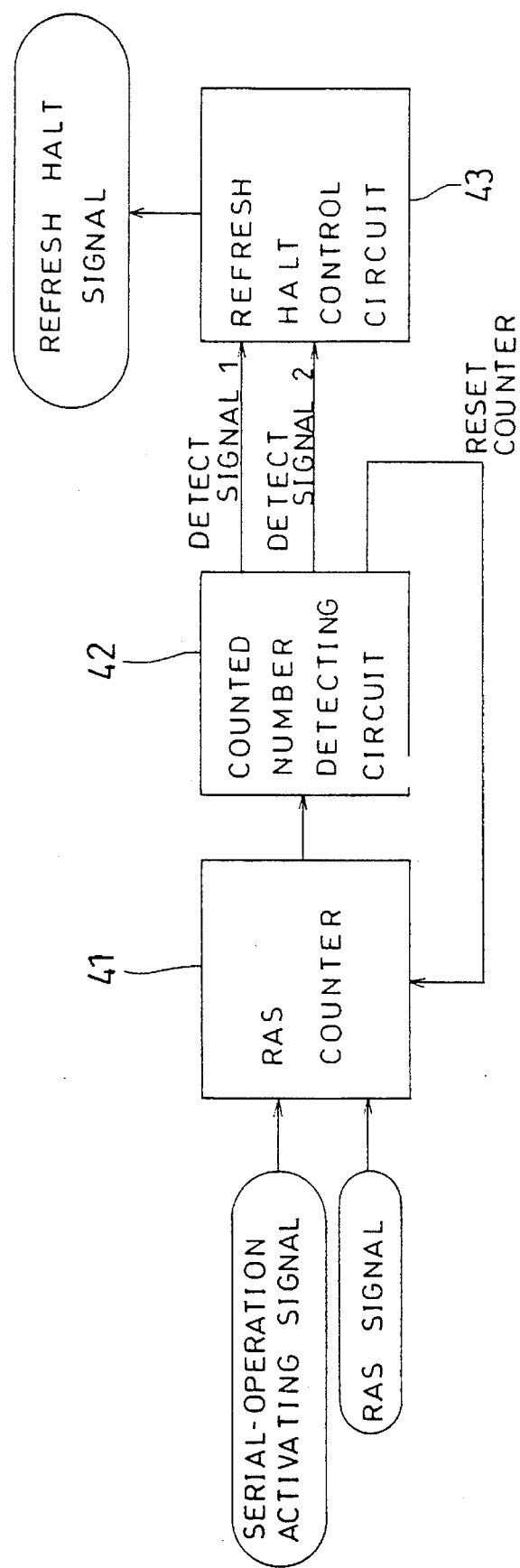
FIG. 4 is a block diagram silowing the structure of a characteristic portion of the first embodiment according to the present invention.

To eliminate the disadvantage, the characteristics of the present embodiment are embodied as shown in FIG. 4.

In the drawing, a reference numeral 41 designates a RAS counter (counter) for counting the number of RAS signals serving as the basic clocks for fetching addresses inputted from the outside. The RAS counter is activated by a serial-operation activating signal. A reference numeral 42 designates a counted number detecting circuit for detecting the number counted by the RAS counter 41, which predetermines a counted number to be detected and outputs detect signals 1 and 2. The above detect signal 1 is outputted when the counted number detecting circuit counted up to (n−3), while the detect signal 2 is outputted when the counted number detecting circuit counted up to n. The above RAS counter 41 and counted number detecting circuit 42 constitute a pre-switching-time predicting circuit for predicting a time point immediately before a predetermined time at which each of the memory arrays 1 is switched from the unselected state to the selected state by the above memory-array selecting circuit 5.

A reference numeral 43 designates a refresh halt control circuit (refresh inhibit circuit) for generating a refresh halt signal in response to the above detect signals 1 and 2. The refresh halt signal makes a transition to the High level on the falling edge of the above detect signal 1 and makes a transition to the Low level on the falling edge of the detect signal 2, so as to be inputted to the clock generator for self-refresh 6 of FIG. 1.

Next, the characteristic operation of the present invention will be described with reference to the timing chart of FIG. 5. The RAS counter 41 initiates operation in response to the serial-operation activating signal and counts from 1 to n. When the RAS counter 41 has counted up to (n−3), the detect signal 1 makes a transition to the High level. When the RAS counter 41 has counted up to n, the detect signal 2 makes a transition to the High level.

Here, the number n counted by the RAS signal corresponds to the number of RAS signals which are inputted with respect to one or more memory arrays that have been selected. In the case of serially operating a memory, the word lines are serially accessed, in general, so that the number of RAS signals inputted with respect to the memory arrays, i.e., the number of the selected word lines is constant.

Figure 5:
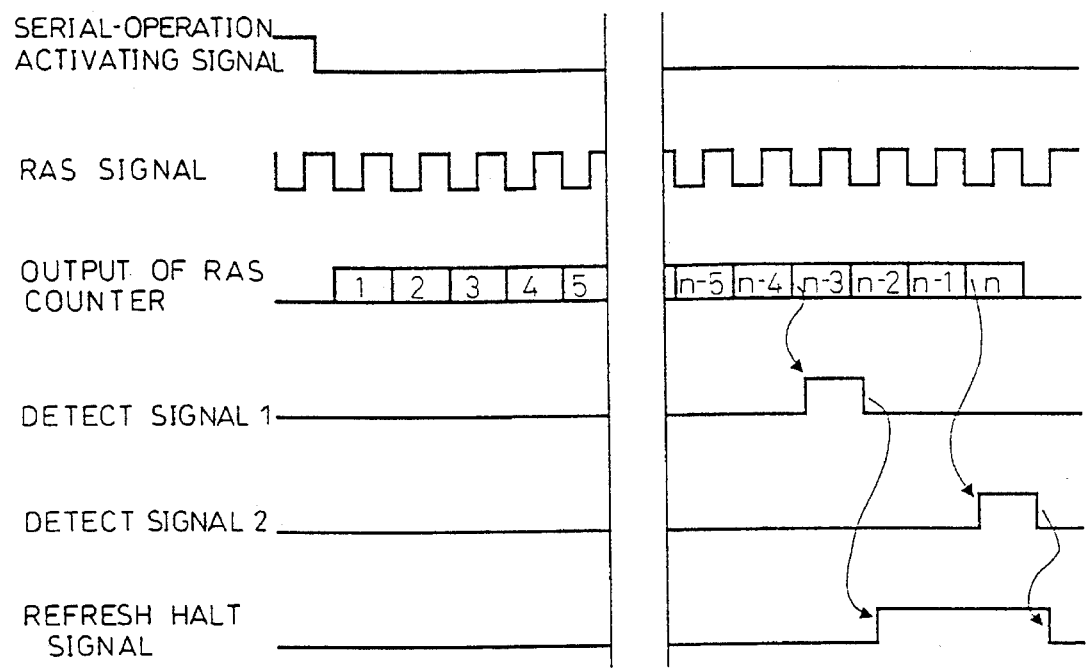
FIG. 5 is a view showing the waveforms of detect signals 1 and 2 and of a refresh halt signal.

In the example of FIG. 5, therefore, the content of the memory array select signal is switched when the number counted by the RAS counter 41 reaches n. Before the content of the memory array select signal is switched, the refresh halt signal makes a transition to the High level on the falling edge of the detect signal 1 and makes a transition to the Low level on the falling edge of the detect signal 2. The refresh halt signal is inputted to the clock generator for self-refresh 6 of FIG. 1 so as to halt the operation of the generator 6, thus halting the self-refresh operation. Consequently, the refresh operation is halted during the predetermined period immediately before the time at which the memory array select signal is switched.

Figure 6:
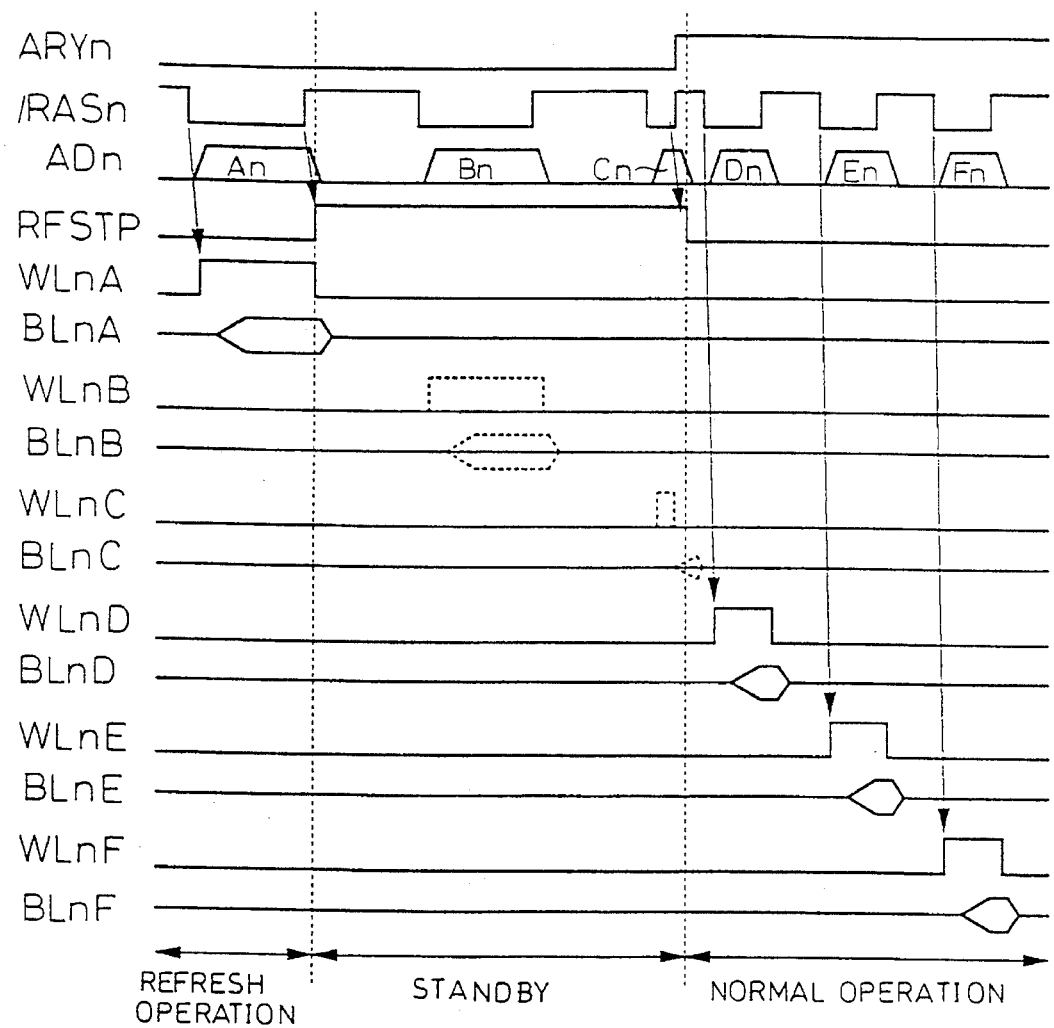
FIG. 6 is a view showing the timing chart of the characteristic portion of the first embodiment according to the present invention.

A detailed description will be given to the foregoing operation with respect to the timing chart of FIG. 6. FIG. 6 was obtained by adding the refresh halt signal RFSTP to FIG. 3. As described above, since the self-refresh operation is halted in response to the refresh halt signal, the word lines WLnB and WLnC are not selected during the refresh operation, which is different from FIG. 3. Consequently, the bit line BLnC is not subjected to the amplifying operation, as shown in FIG. 6 by the dotted sector so that an insufficient refresh operation can be prevented.

As for the word lines which have not been refreshed by the above forcible halting of the refresh operation, if they are in the memory arrays which were switched to the normal read/write operation, they are equivalently subjected to the refresh operation through serial accesses to all the word lines during the normal read/write operation. If the word lines which have not been refreshed yet are in the memory arrays remaining to be selected, they are refreshed by the subsequent refresh operation, since the corresponding refresh counter 4 of FIG. 1 latches the final address that has been refreshed.

SECOND EMBODIMENT

In the above first embodiment, the normal read/write operation is performed when the specified memory array 1 was selected, while the refresh operation is performed when the specified memory array was not selected. Here, a consideration will be given again to the case where the 256M-bit chip of 16-bit parallel type is serially operated. It is assumed that eight 32M-bit memory arrays are used.

If the specified memory array is selected, 32M bits are read or write by 16-bit parallel conversion. The minimum operating frequency fMIN for satisfying the equation of refresh cycle=128 milliseconds in relation to one 32M-bit memory array becomes $$fMIN = (32M \text{ bits}/16 \text{ bits})/128 \text{ milliseconds}$$
$$= 16.384 \text{ MHz}.$$

That is, if the operating frequency becomes 16.384 MHz or lower, it is insufficient to refresh only the unselected memory arrays as in the above first embodiment. Even in the selected memory array, it is required to interrupt the normal read/write operation with the refresh operation.

If a consideration is given to the case where image data is compressed, since the data transfer rate in accordance with MPEG2, which is an international specification, is 5M to 10M bits/second, the operating frequency obviously becomes 312.5 KHz to 625 KHz in 16-bit parallel configuration. That is, if the data compressed in accordance with MPEG2 is applied to the 256M-bit memory in the above example, the refresh operation in the above first embodiment is insufficient and it is required to perform the refresh operation with respect to the selected memory array.

In view of the foregoing, the present embodiment has adopted the constitution in which the refresh operation can be performed with respect to the selected memory array by interrupting the normal read/write operation. If the operating frequency is low, the cycle of the normal read/write operation with respect to data on one word line is long so that the latching of the data on the word line is completed at an early stage in the cycle, thereby performing the refresh operation by utilizing the remaining time in the cycle.

Figure 7:
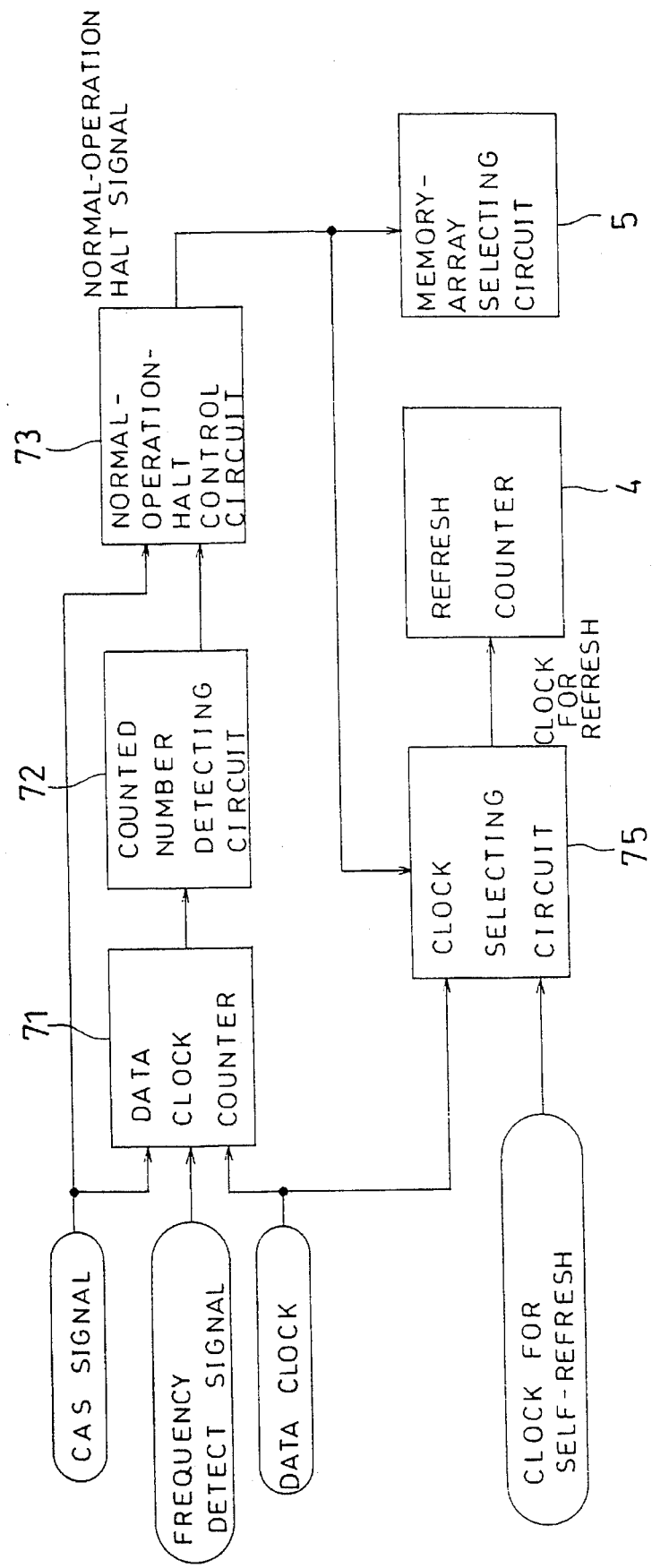
FIG. 7 is a block diagram showing the structure of a second embodiment according to the present invention.

Below, the present second embodiment will be described with reference to FIG. 7.

In the drawing, a reference numeral 71 designates a synchronizing signal for sequentially reading/writing data from the outside, i.e., a data clock counter (clock counter) for counting the number of data clocks. The data clock counter 71 is activated by the basic clock for fetching an address for selecting data from one word line, i.e., CAS signal. A reference numeral 72 designates a counter number detecting circuit for detecting the number counted by the above data clock counter 71, which predetermines a specified value for the counted number (i.e., the value obtained at the time at which access to data on one word line in the selected memory array is completed) and outputs a detect signal when the counted number reaches the predetermined value. The above data clock counter 71 and counted number detecting circuit 72 constitute an access-completion detecting circuit for detecting the completion of access to data on one word line in the selected memory array.

A reference numeral 73 designates a normal-operation-halt control circuit for generating a normal-operation halt signal in accordance with the above detect signal and CAS signal. The normal-operation-halt control circuit 73 generates the normal-operation-halt signal in response to the detect signal from the above counted number detecting circuit 72 and halts the generation of the normal-operation halt signal on the falling edge of the CAS signal. The normal-operation halt signal is inputted to the memory-array selecting circuit 5 and clock selecting circuit 75 shown in FIG. 1. The above clock selecting circuit 75 is for selecting, in accordance with the normal-operation halt signal, the data clock when the normal-operation-halt signal is activated or the word-line basic clock for self-refresh when the normal operation halt signal is inactivated. The output from the clock selecting circuit 75 is transferred to the refresh counters 4 shown in FIG. 1. The above clock selecting circuit 75 constitutes a cycle setting circuit for setting, when the above normal-operation-halt control circuit 73 halts the selection of the memory array 1, a shorter increment cycle for the refresh address off the refresh-signal generator.

The operation or standby of the above data clock counter 71 is determined by the detect signal indicating the frequency of the data clock. That is, the data clock counter 71 is activated when the operating frequency of the data clock is low and the data clock counter 71 is inactivated when the operating frequency of the data clock is high. Consequently, the same operation as performed in the above first embodiment is performed when the operating frequency is high. In setting the frequency detect signal, it is possible to add a bonding option used in the selection of bit configuration, adopt the fuse program method used in programming a redundant address, or input a frequency select signal from the outside of the chip when the operating frequency is changed.

Next, the operation of the present embodiment will be described with reference to the timing chart of FIG. 8, which shows the state in which one memory array 1 is selected and the normal read/write operation is performed. During the serial operation, the CAS signal is inputted every several clocks. In other words, after one column address was inputted, the read/write operation is performed in synchronization with the data clock with respect to each of the plurality of bits in sequence.

The CAS signal activates the data clock counter 71 so as to initiate counting operation. In FIG. 8, the data clock counter 71 has counted from 1 to 16. By the time the counted number reaches a predetermined value (e.g., 11), an access is made to data corresponding to the column address CA1, which exists correspondingly to the word line 1 for normal operation.

With the timing 1 with which the number counted by the data clock counter 71 becomes 11, the access to the data on one word line in the selected memory array is completed and the detect signal from the counted number detecting circuit 72 makes a transition to the High level, while the normal-operation halt signal makes a transition to the High level. Since the normal-operation halt signal was activated with the timing 1, as described above, the clock selecting circuit 75 selects the data clock, so that the word-line basic clock presents a waveform which reflects the data clock. As a result, the word line 1 for normal operation makes a transition from the High level to the Low level, while the word lines 2 to 7 are sequentially selected in synchronization with the word-line basic clock for refresh, thereby performing the refresh operation.

Then, the subsequent CAS signal is inputted with the timing 2 shown in FIG. 8, so that the data clock counter is reset, while the normal-operation halt signal makes a transition from the High level to the Low Level. Consequently, the normal read/write operation is restored and the word line 1 is selected again so as to resume the access to data at the column address CA2.

Thus, according to the present embodiment, not only the memory arrays which have not been selected are refreshed, as in the above first embodiment, but the refresh operation can also be performed with respect to the selected memory array by interrupting the normal operation. Consequently, even when the operating frequency of the data clock becomes low, it is not necessary to control the refresh operation from the outside.

VARIATION OF SECOND EMBODIMENT

Figure 9:
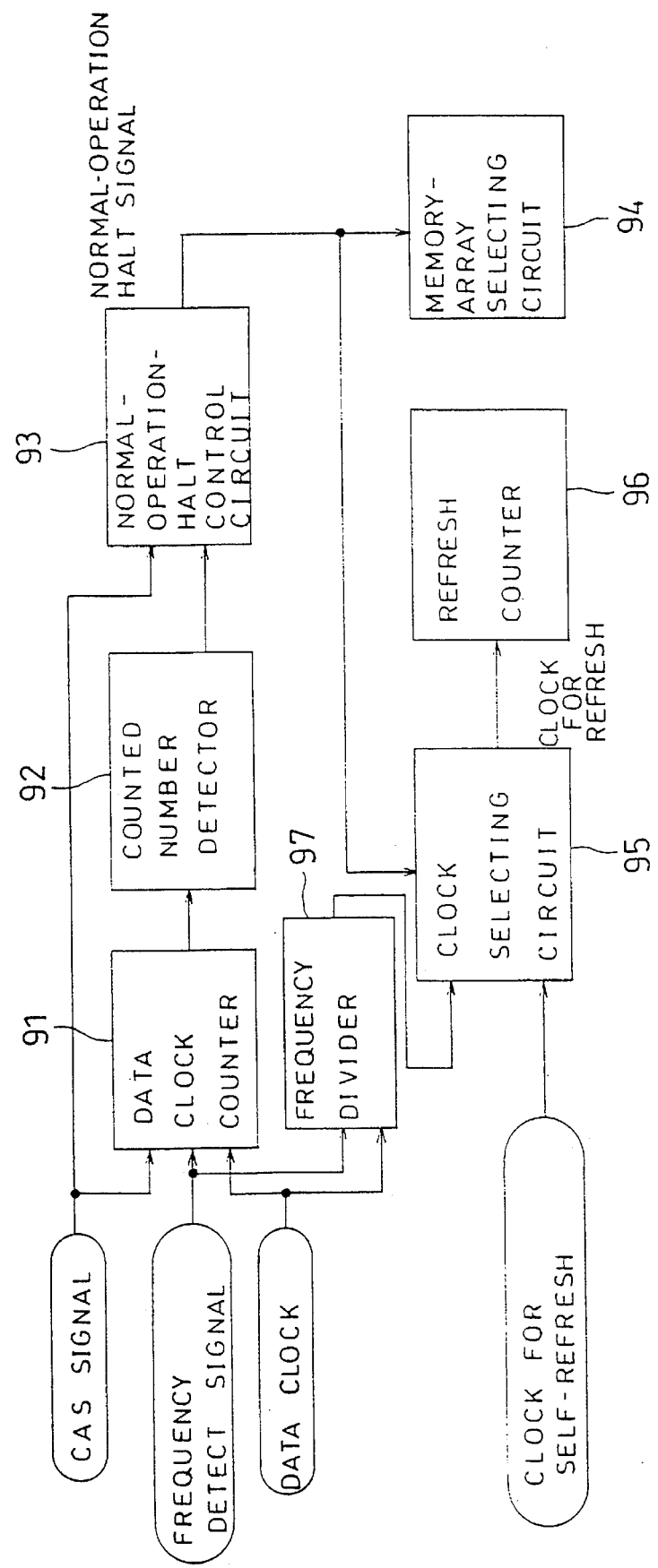
FIG. 9 is a block diagram showing the structure of a variation of the second embodiment according to the present invention.
Figure 10:
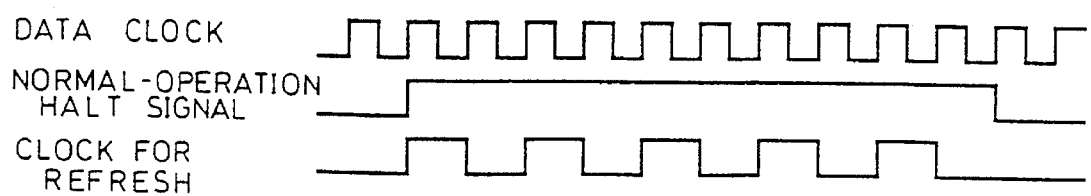
FIG. 10 is a view showing the timing chart of the second embodiment according to the present invention.

In the above second embodiment, the refresh operation is performed in the same cycle time as that of the data clock during the normal operation. Accordingly, if the operating frequency is, e.g., 12 MHz in the above example of 256M bits, the cycle time becomes about 83 ns, which provides excessively early timing for performing the operation of activating and inactivating the word lines, so that it becomes difficult to perform the refresh operation. To overcome the problem, a variation of the above second embodiment has been implemented, which will be described with reference to FIG. 9. The basic structure of the variation is the same as that of the second embodiment, except that a frequency divider 97 is provided in the variation. Whether or not the frequency divider 97 should divide the frequency of the data clock, which is the input waveform of the frequency divider 97, is determined by the frequency detect signal. Although the data clock is inputted as it is to the clock selecting circuit 95 in the above second embodiment, the data clock is inputted via the frequency divider 97 to the clock selecting circuit 95 in the present variation. With the structure, the word-line basic clock for refresh operates in a cycle time double the data clock, as shown in the timing chart of FIG. 10. Consequently, the frequency of the refresh operation, which was initially about 83 ns, becomes about 166 ns, thereby providing a sufficient operation margin.

THIRD EMBODIMENT

Although the memory arrays which have not been selected are subjected to the refresh operation in the foregoing description, since the word-line basic clock for self-refresh from the clock generator for self-refresh 8 in FIG. 1 is used in common by all the memory arrays 1, it follows that the refresh operation is performed with respect to seven 32M-bit memory arrays at the same time on a 256M-bit chip. If the refresh operation is performed with respect to the seven memory arrays 1 at the same time, it is expected that an extremely large peak current is allowed to flow simultaneously with the activation of the word lines, amplification by a sense amplifier, and resetting of the refresh operation. The peak current is disadvantageous in that it causes a variation in the level of the power-source voltage on a power-source line.

Figure 16:
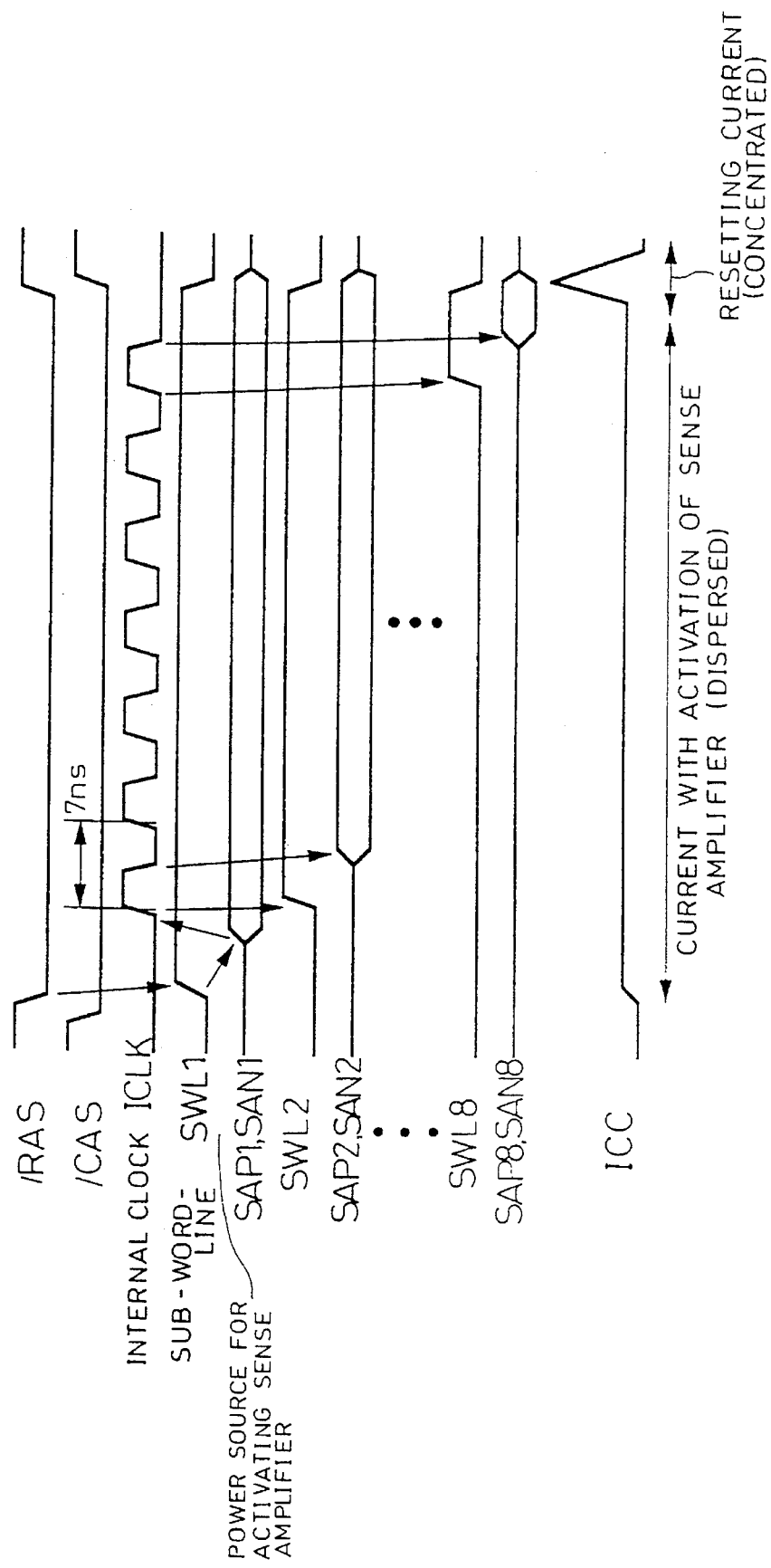
FIG. 16 is a view showing the timing chart of the refreshing system of FIG. 15.

Below a description will be given to prior art technology for reducing a variation in the level of the power-source voltage in the above refresh operation (see 1993 IEEE International Solid-State Circuits Conference Digest of Technical Papers, pp.50–51, February 1993). FIG. 16 is a block diagram and FIG. 17 is a timing chart.

In FIG. 16, a reference numeral 161 designates a memory array which has been divided into eight sections and SWL indicates a word line in the memory array 161. Shift registers SR are operated by an internal clock ICLK and word lines SWL in the eight memory arrays are sequentially selected and refreshed in accordance with the shift registers SR. As shown in the timing chart of FIG. 17, since the word lines SWL1 to SWL8 are sequentially selected and activated, the peak current in activating the sense amplifier is dispersed so that a large peak current as observed in the power-source current waveform ICC is not generated. However, since the inactivation of the word line is timed to the rising edge of the internal clock ICLK and the activation of the sense amplifier is timed to the falling edge of the internal ICLK, resetting associated with the word line is performed at a time, so that it is expected that a large peak current is observed in the power-source voltage waveform ICC.

That is, in the above prior art, since each word line in a normal DRAM is divided into eight sections, the internal clock ICLK can be set only at a short pulse of 7 ns, so that the reset timings cannot be set at a plurality of points by time division. This is because, if reset timings are to be set at a plurality of points by time division by extending the cycle of the internal clock ICLK, the cycle time for activating the whole word line divided into eight sections (cycle time for activating one word line in a normal DRAM) increases, resulting in a refresh period longer than that for the normal DRAM and a reduced efficiency with which the chip is used.

Figure 17:
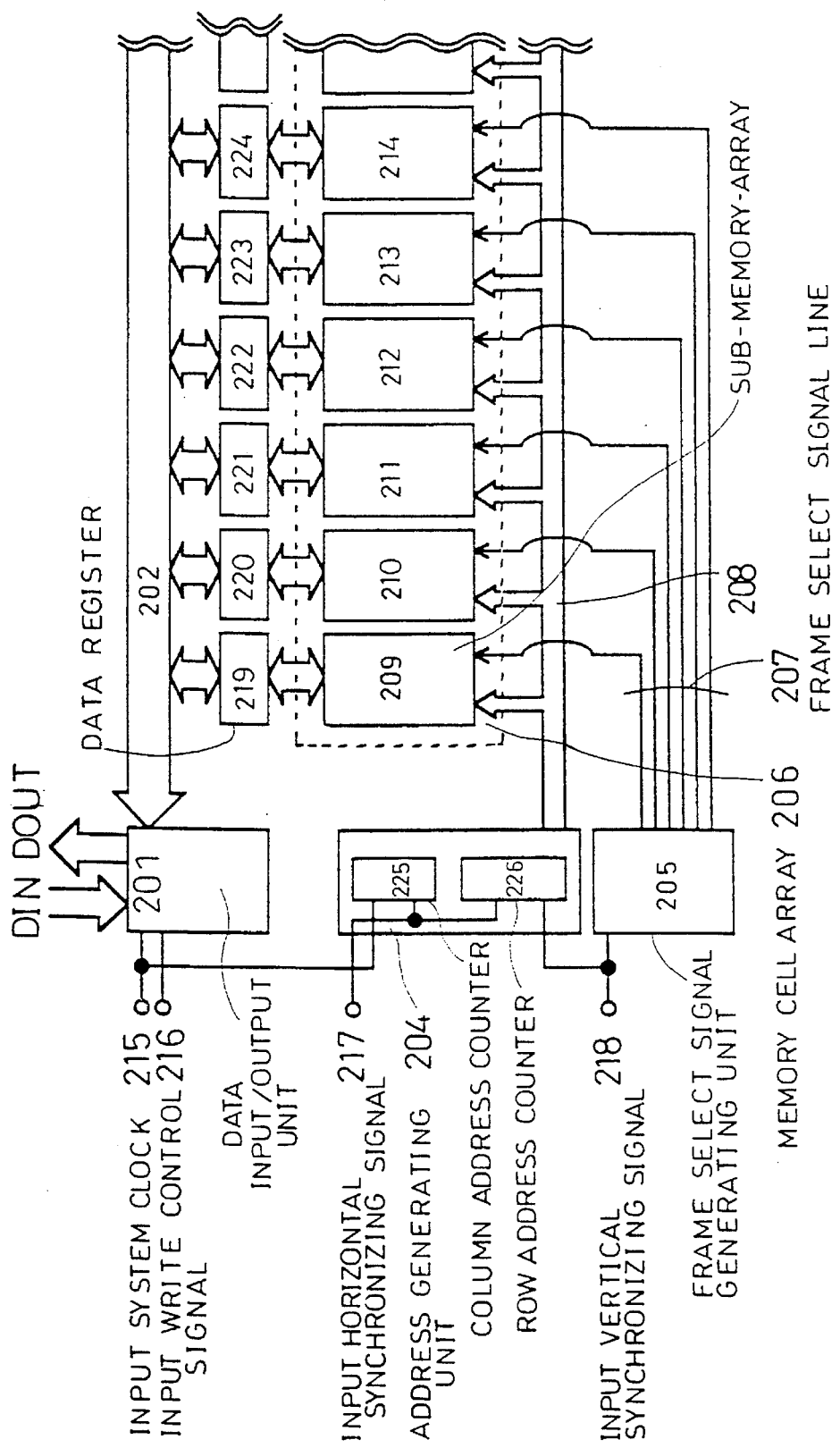
FIG. 17 is a view schematically showing the structure of a moving-picture storing memory in a fifth embodiment of the present invention.

In the above prior art, the peak current at the time of resetting shown in FIG. 17 does not cause a problem since the operation of activating the sense amplifier, which is susceptible to a variation in the level of the power-source voltage, is not performed with the timing with which the word line is reset. In the present embodiment, however, it is expected that a malfunction occurs in the normal read/write operation due to a variation in the voltage level on the power-source line at the time of resetting, since the normal read/write operation is performed simultaneously and asynchronously with the refresh operation.

Figure 11:
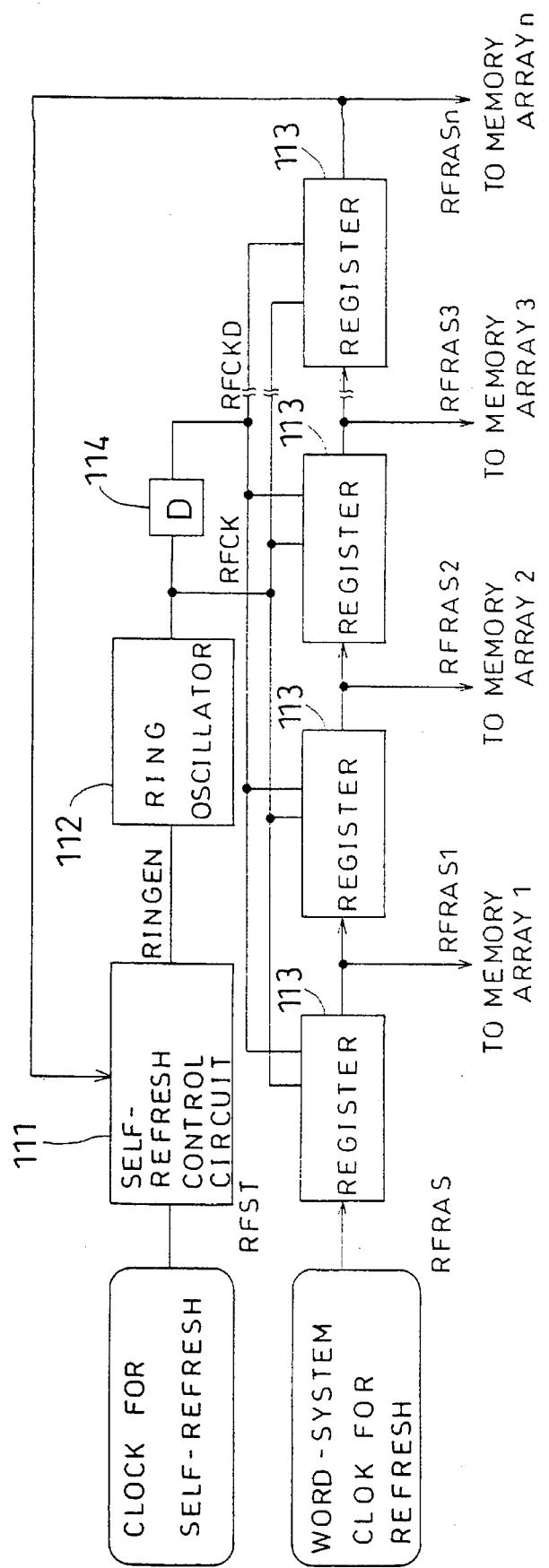
FIG. 11 is a block diagram showing the structure of a third embodiment according to the present invention.

The present third embodiment has adopted the structure shown in FIG. 11 in order to overcome the above problem. In the drawing, the word-line basic clock for self-refresh RFST is inputted to a self-refresh control circuit 111 for generating an activating signal RINGEN. A reference numeral 112 designates a ring oscillator, which is activated by the above activating signal RINGEN and generates a clock RFCK for a plurality of registers (shift register circuits) 113. A reference numeral 114 is a delay device for delaying the clock RFCK from the ring oscillator 112 and generating a delay clock RFCKD, which is transferred to each of the shift registers 113.

To the first stage of the shift registers 113 is inputted the word-system clock for refresh RFRAS. The output From each stage of the shift registers 113 is transferred as the word-line basic clock for refresh to each of the memory arrays 1. The output from the final stage of the shift registers 118 is inputted to the above self-refresh control circuit 111 and halts the operation of the ring oscillator 112.

The above ring oscillator 112 and the plurality of registers 113 constitute a delay circuit for generating a delayed word-line basic clock for refresh obtained by delaying the word-line basic clock for refresh generated by the refresh-signal generator by a predetermined period within the increment cycle for the refresh address generated by the above refresh-signal generator.

Figure 12:
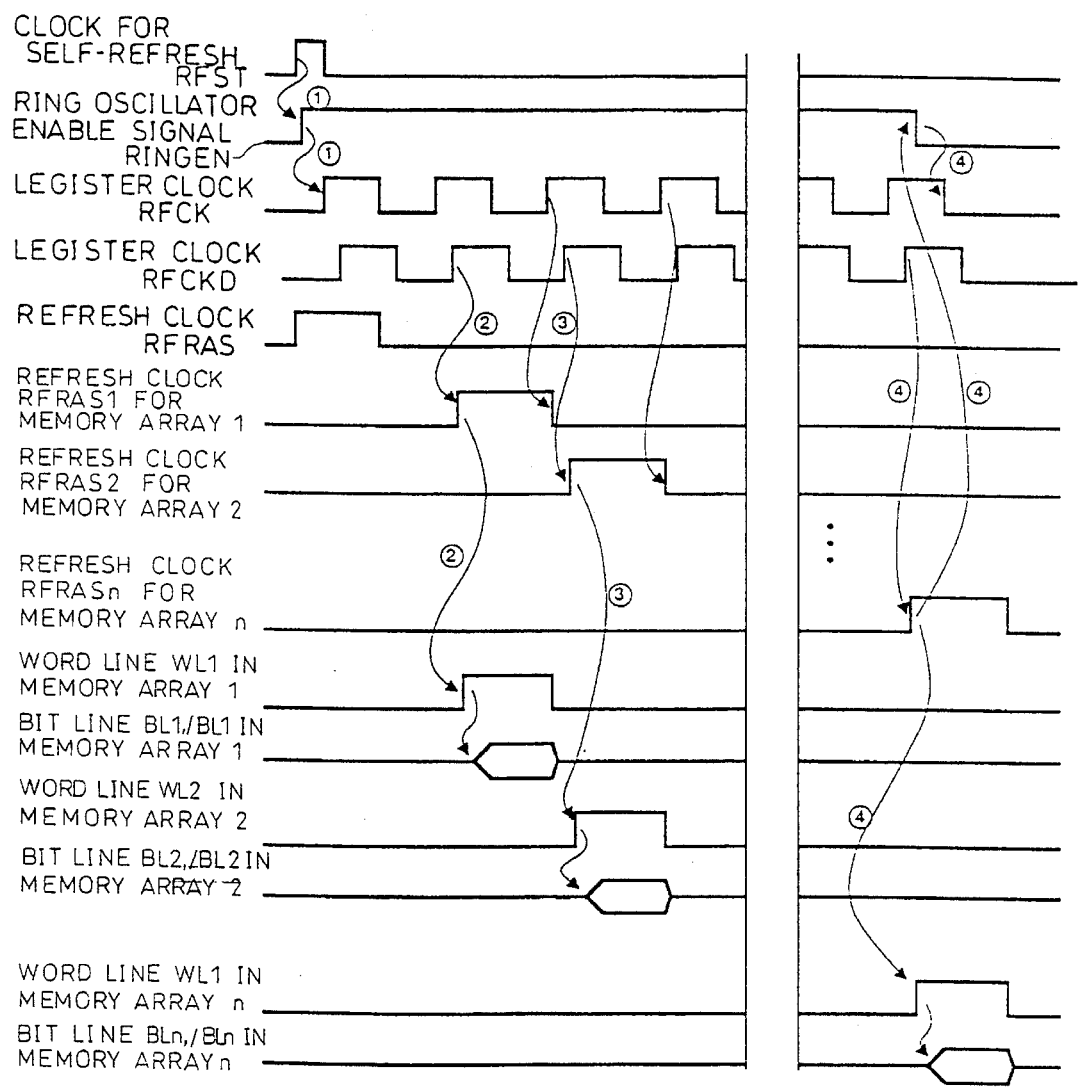
FIG. 12 is a view showing the timing chart of the third embodiment according to the present invention.
Figure 15:
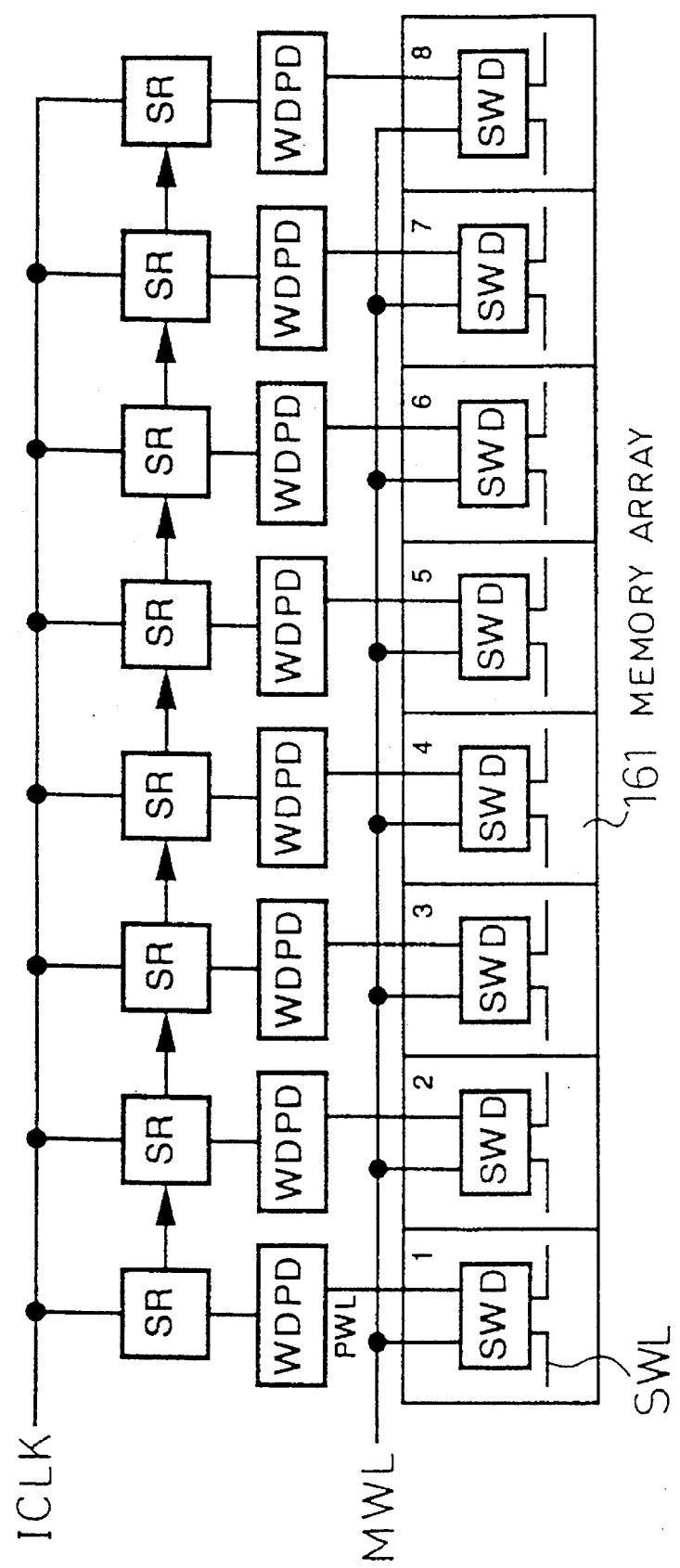
FIG. 15 is a block diagram of the conventional refreshing system.

Next, the operation of the present embodiment will be described with reference to the timing chart of FIG. 12.

The word-line basic clock for self-refresh RFST causes the ring oscillator enable signal RINGEN to make a transition to the High level, so as to initiate the operation of the ring oscillator 112. With the timing 1, the clock for shift registers RFCK and the delay clock RFCKD are outputted to the shift registers 113, while the first stage of the shift registers 113 fetches the word-line basic clock for refresh RFRAS. In FIG. 12, the first stage of the shift registers 113 transfers data fetched on the rising edge of the delay clock RFCKD.

Subsequently, with the timing 2 shown in the drawing, the refresh clock RFRAS 1 for memory array 1 is transferred from the first stage of the shift registers 118 to the memory array 1 so as to activate the word line WL1 and bit lines BL1 and /BL1 in the memory array 1, thereby performing the refresh operation from activation associated with the word line to resetting in one cycle of the clock RFCK. As can be seen from FIG. 12, the other memory arrays are in the standby state.

The reset timing for the refresh clock RFRAS1 is synchronized with the rising edge of the clock RFCK. The structure has been adopted so that the resetting of the word line WL1 in the memory array 1 is shifted in time from the falling edge of the word line WL2 in the memory array 2.

Likewise, the refresh clock RFRAS2 for the memory array 2 is transferred from the second stage of the shift registers 113 to the memory array 2 with the timing 3 shown in the drawing so as to activate the word line WL2 and bit lines BL2 and /BL2, thereby performing the refresh operation. Finally, the refresh operation is performed with respect to the memory array n with the timing 4, thus completing the refresh operation for all the memory arrays, while causing the activating signal RINGEN for the ring oscillator 112 to make a transition to the Low level and resetting the clock RFCK for registers.

Thus, according to the present embodiment, the refresh operations are performed with respect to the plurality of unselected memory arrays 1 to n at different times, while the refresh operation from activation associated with the word line to resetting operation are performed for each of the memory arrays 1 in one cycle of the clock for registers, so that it becomes possible to disperse the peak current at the time of activating the memory cell in the refresh operation and the peak current at the time of resetting the refresh operation so as to reduce their maximum values, thereby minimizing a variation in the voltage level on the power-source line. Consequently, the normal read/write operation can be performed properly for the selected memory array at the same time as the refresh operation for the above plurality of unselected memory arrays without being affected by a variation in the level of the power-source voltage, which might have caused a malfunction.

FOURTH EMBODIMENT

In the foregoing description, unlike self-refreshing in the normal standby state (hereinafter referred to as data holding mode), the normal read/write operation and refresh operation are performed asynchronously and simultaneously. As a result, the normal read/write operation causes a variation in the potential of the substrate and chip temperature, so that it is expected that the pause-time characteristic of the memory cell deteriorates and the stored charge leaks off earlier than in the above data holding mode. Hence, it is required to set the cycle of the refresh operation to be performed simultaneously with the normal operation in the present invention longer than the refresh cycle in the above data holding mode.

However, if the cycle of the refresh operation is set equal to that of self-refreshing in the normal operation of the present invention, the spec of refreshing is satisfied but a current for refreshing increases with a reduction in cycle, which consequently increases a current for holding data disadvantageously. On the other hand, if the cycle of the refresh operation is set comparatively long in accordance with the pause-time characteristic in the data holding mode, it is difficult to perform excellent refreshing.

The present embodiment has adopted the structure shown in FIG. 13 so as to overcome the above problem. In the drawing, the output from the memory-array selecting circuit 5 is inputted to an OR circuit 132 (selection detecting circuit) and a refresh-cycle select signal outputted from the OR circuit 132 is inputted to a refresh-cycle selecting circuit 133. On the other hand, two types of timers are provided for determining the refresh cycle. A timer A134 (first timer circuit) is for the data holding mode, which sets a comparatively long refresh cycle, while a timer B135 (second timer circuit) is for the self-refresh mode for the normal operation, which sets a comparatively short refresh cycle.

If all the inputs to the above OR circuits 132 are at the Low level, which indicates that none of the memory arrays has been selected, the refresh-cycle select signal makes a transition to the Low level, so that the refresh-cycle selecting circuit 133 selects the timer A134. If one or more of the inputs to the OR circuit 132 are at the High level, which indicates that one or more memory arrays have been selected, the refresh-cycle select signal makes a transition to the High level, so that the refresh-cycle selecting circuit 133 selects the timer B135.

Thus, in the present embodiment, an optimum refresh cycle can be selected in accordance with the refresh mode adopted, so that the current for holding data can be reduced in the data holding mode by reducing the current for refreshing, while performing, if one or more memory arrays have been selected, self-refreshing with respect to the other memory arrays that have not been selected at optimum times, thereby improving the performance of the chip.

FIFTH EMBODIMENT

FIG. 17 is a schematic view of the semiconductor memory in a fifth embodiment according to the present invention.

In the drawing, a reference numeral 201 designates a data input/output unit (data input/output means), 202 designates a data transmission bus, 204 designates an address generating unit, 205 designates a frame-select-signal generating unit (sub-memory-array selecting means), 206 designates a memory cell array, 207 designates a frame select signal line, and 208 designates an address bus. Reference numerals 209 to 214 designate sub-memory-arrays, each for storing data on one frame. A reference numeral 215 designates a system-clock input terminal, 216 designates a write-control-signal input terminal, 217 designates an input terminal for receiving a horizontal synchronizing signal, and 218 designates an input terminal for receiving a vertical synchronizing signal, which is outputted every time a predetermined number of horizontal synchronizing signals are outputted. Reference numerals 219 to 224 designate data registers. A reference numeral 225 designates a column address counter and 226 designates a row address counter.

As shown in FIG. 17, the memory cell array 206 is divided into the plurality of sub-memory-arrays 209 to 214. The sub-memory-arrays 209 to 214 are obtained, if the memory cell array 206 has a small capacity, by dividing the memory cell array 206 on the basis of data on one field that has been interlaced. If the memory cell array 206 has a large capacity, it is divided on the basis of data on one frame that has been non-interlaced. To the sub-memory-arrays 209 to 214 are connected data registers (serial-to-parallel converting circuits) 219 to 224 for use in serial-to-parallel or parallel-to-serial conversion, which increases the data transfer rate. If data is to be transferred at a low rate, the data registers are not particularly required.

To store a moving picture by saving one frame after the other in the individual sub-memory-arrays, the sub-memory-arrays 209 to 214 are sequentially selected by the outputs from the frame-select-signal generating unit 5. The above frame-select-signal generating unit 205 is internally provided with a counter circuit, so that it is controlled using the vertical synchronizing signal as an increment signal for the counter.

The above address generating unit 204 has the column address counter 225 and the row address counter 226. The above column address counter 225 is controlled by the system clock of the moving-picture displaying apparatus which has been inputted as the increment signal from the system-clock input terminal 215 and by the horizontal synchronizing signal which has been inputted as a clear signal. On the other hand, the row address counter 226 is controlled by the horizontal synchronizing signal which has been inputted as the increment signal from the horizontal-synchronizing-signal input terminal 217 and by the vertical synchronizing signal which has been inputted as the reset signal from the vertical-synchronizing-signal input terminal 218.

The selection of a memory cell (not shown) in each of the sub-memory-arrays 209 to 214 is performed by transmitting the output from the address generating unit 204 via the address bus 208. The row and column addresses transmitted along the address bus 208 are used in common by the sub-memory-arrays 209 to 214, so that the memory cell is selected only in the selected sub-memory-array. The above row address is an address of a line in the image, while the column address corresponds to a dot address on the line.

The above data input/output unit 201 performs the reading or writing of data under the control of a write control signal inputted from the write-control-signal input terminal 216 and data is inputted or outputted in accordance with the frequency of the system clock. At present, the highest data transfer rate is about 1.2 G bits/sec in HDTV at baseband, so that it is compatible with the current image displaying system as long as the highest transfer rate can be obtained. To obtain the highest data transfer rate, the input/output rate of 159 MHz or higher is required if the number of data input/output terminals (not shown) is eight, while the input/output rate of 75 MHz or higher is required if the number of data input/output terminals (not shown) is sixteen. To implement the inputting or outputting of data at the rates, the data registers 219 to 224 used in the above serial-to-parallel or parallel-to-serial conversion are provided on the present chip, which maintains the rate inside the chip lower than the rate outside the chip.

The above system clock, horizontal synchronizing signal, and vertical synchronizing signal are used in a system for storing a moving picture by means of the semiconductor memory according to the present embodiment.

FIG. 18 is a timing chart for showing the relationship between a control clock and internally generated signals in the fifth embodiment. In the drawing, VD indicates the vertical synchronizing signal, HD indicates the horizontal synchronizing signal, SC indicates the system clock, FN indicates the frame select signal, LN indicates the line address, and DN indicates the dot address. The vertical synchronizing signal VD functions as an increment signal for the frame select signal FN and as a reset signal for the line address LN, while the horizontal synchronizing signal functions as an increment signal for the line address LN and as a reset signal for the dot address DN. The system clock SC functions as an increment signal for the dot address DN.

The above plurality of memory cell arrays 209 to 214 which have been physically divided operate simultaneously. These memory cell arrays are collectively disposed in one place. With the structure, only the control circuits and control signal lines which collectively control the cell arrays are operated, while the operation of the other control circuits are halted, thereby lowering power consumption and collectively disposing in one place the memory cell arrays in the standby state.

In the present moving-picture storing memory, since data is sequentially stored and outputted, if the storage capacity of the present moving-picture storing memory is large and hence the time required for outputting all the data is longer than the time during which the memory cells hold data, the above unselected memory cell arrays collectively disposed in one place are refreshed while the selected memory cell array performs the inputting or outputting of data.

Although the present embodiment has disposed the frame-select-signal generating unit 205 on the chip provided with the memory cell array 206 so that the frame select signal is generated inside the chip, if the area of the chip, package size, and the like allows, the frame select signal can be inputted from the outside, which increases the ease of use of the chip and the performance of the system. Similarly, if the address is inputted from the outside, random access can also be performed, so that the memory can be used not only for simply storing a moving picture but also for processing signals or other purposes.

SIXTH EMBODIMENT

FIG. 19 is a view schematically showing the structure of a principal portion of the moving-picture storing memory in a sixth embodiment of the present embodiment, which particularly shows only the portions of the cell arrays and data registers.

Although the data registers 219 to 224 are connected to the sub-memory-arrays 209 to 214, respectively, in the above fifth embodiment shown in FIG. 17, only that of the data registers 219 to 224 which has been connected to the selected sub-memory-array is used. In view of the foregoing, a data register is used in common by the sub-memory-arrays 219 to 224 in the present embodiment, thereby reducing the chip area.

In FIG. 19, a reference numeral 281 designates a register, 282 designates sense amplifiers, 233 designates a pair of data lines, and 234 designates a pair of bit lines. Reference numerals 209' to 212' designate a plurality of sub-memory-arrays similar to those used in the above fifth embodiment.

The above data register 231 is connected to the respective sense amplifiers 232 of the sub-memory-arrays 209' to 212', which have the data register 231 in common.

In the present embodiment, the pair of data lines 233 and the pair of bit lines 234 run parallel to each other. With the structure, the pair of data lines 233 can be connected to the respective sense amplifiers 232 of the sub-memory-arrays 209' to 212'.

Figure 20:
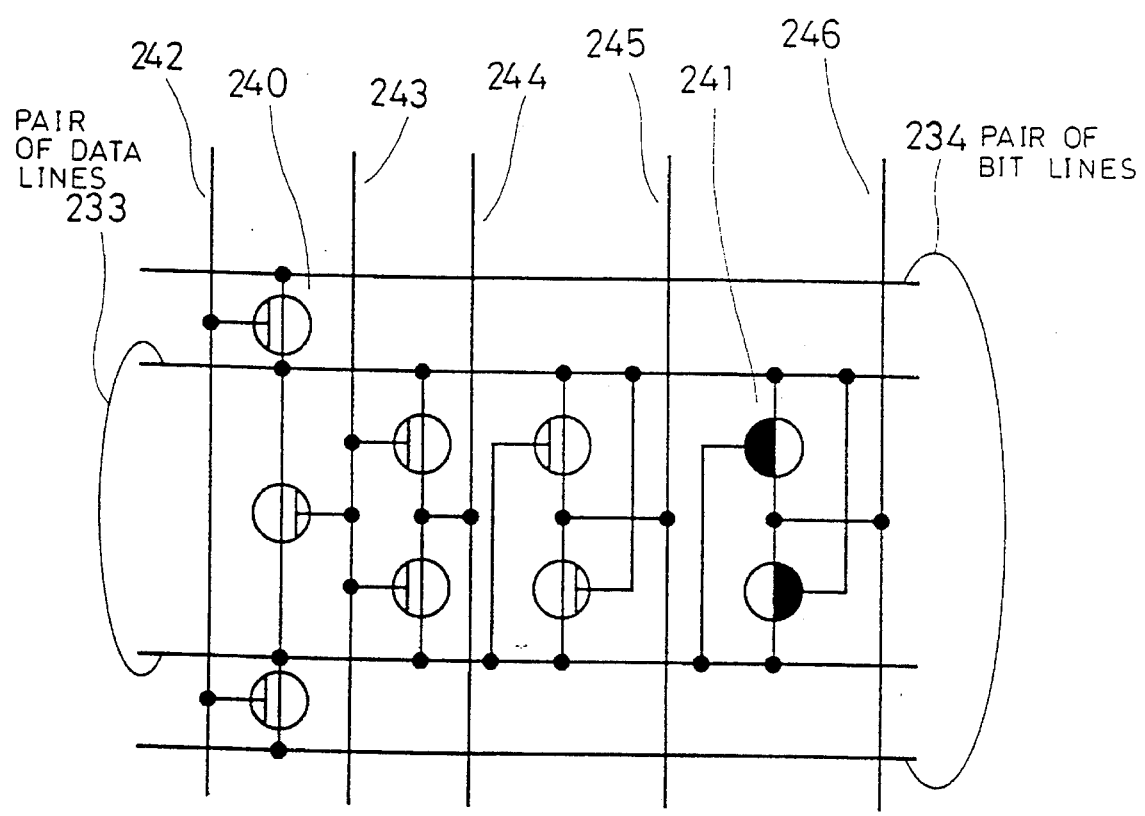
FIG. 20 is a circuit diagram of a sense amplifier in the sixth embodiment of the present invention.

FIG. 20 shows the circuit diagram of the above sense amplifier 232, in which a reference numeral 230 designates an NMOS transistor, 241 designates a PMOS transistor, 242 designates a transfer-gate control signal, 243 designates an equalize signal, 244 designates a precharge power-source line, 245 designates a first sense-amplifier power-source line, and 246 designates a second sense-amplifier power-source line. With the structure, the pair of data lines 233 and the pair of bit lines can run parallel to each other.

SEVENTH EMBODIMENT

Figure 21:
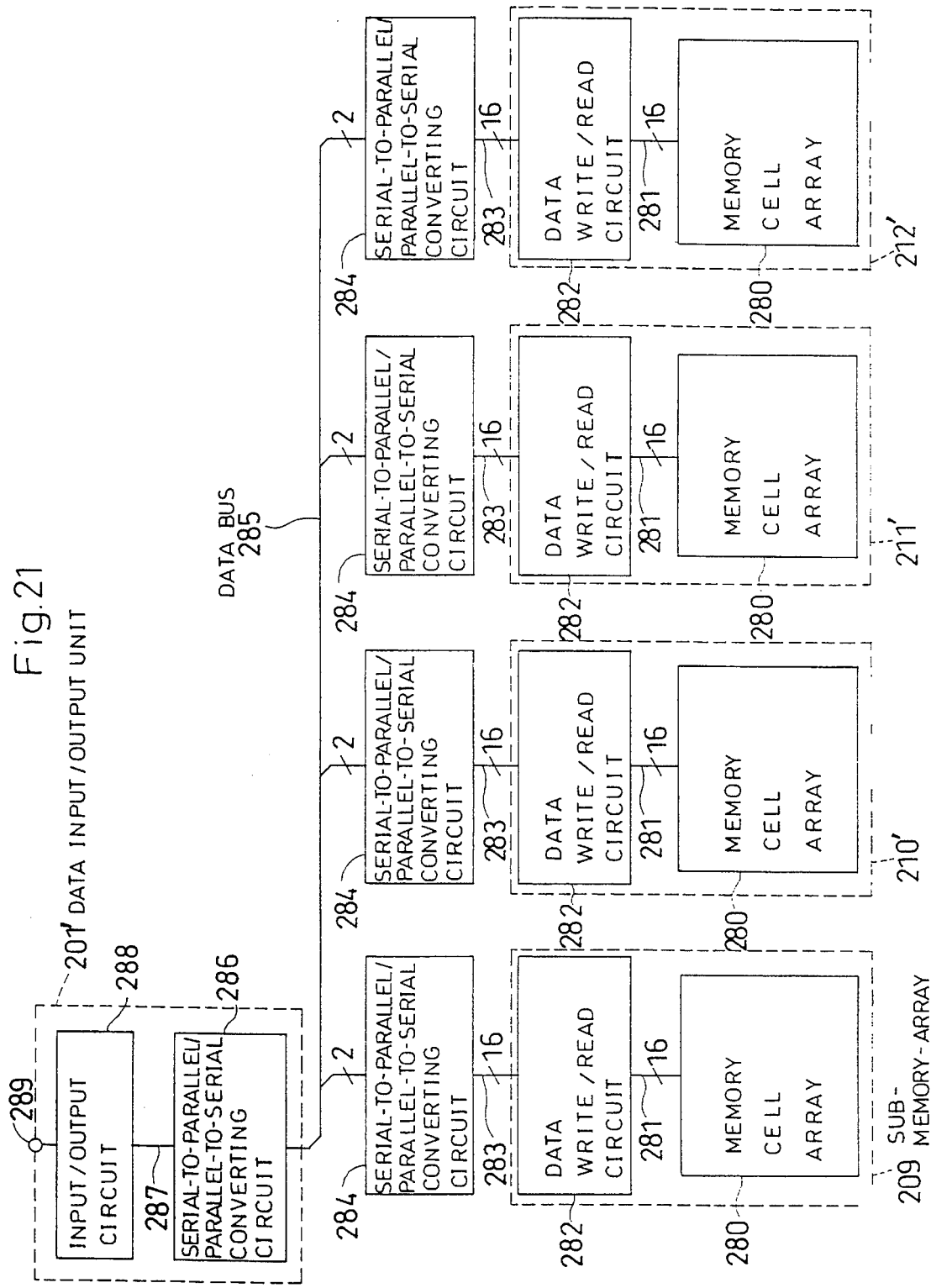
FIG. 21 is a view schematically showing the structure of the moving-picture storing memory in a seventh embodiment of the present invention.

FIG. 21 is a schematic view of the moving-picture storing memory in a seventh embodiment of the present invention.

In the drawing, reference numerals 209', 210', 211', and 212' designate a plurality of memory cell arrays similar to those used in the above sixth embodiment. In each of the memory cell arrays 209' to 212' is provided a data write/read circuit 282 which is connected to a memory cell array unit 280 via a data bus 281.

A reference numeral 201' designates the data input/output unit shown in FIG. 17, in which an input/output circuit 288 and an input/output terminal 289 are provided.

A reference numeral 284 designates first-stage serial-to-parallel/parallel-to-serial converting circuits which are connected to the data write/read circuits 282 of the above memory cell arrays 209' to 212' via data buses 283 and a reference numeral 286 designates a second-stage serial-to-parallel/parallel-to-serial converting circuit which is connected to the input/output circuit 288 of the above data input/output unit 201' via a data bus 287.

The above first-stage serial-to-parallel/parallel-to-serial converting circuits 284 are connected to the above second-stage serial-to-parallel/parallel-to-serial converting circuit 286 via a data bus 285.

The above first-stage serial-to-parallel/parallel-to-serial converting circuits 284 convert data in 16-bit parallel, which has been transferred from the corresponding memory cell arrays 209' to 121' via the data buses 283, to data in 2-bit parallel and convert data in 2-bit parallel, which has been transferred from the data input/output unit 201' via the data bus 285, to data in 16-bit parallel.

On the other hand, the above second-stage parallel-to-serial/serial-to-parallel converting circuit 286 converts data in 16-bit parallel, which has been transferred from the data input/output unit 201' via the data bus 285, to data in 2-bit parallel and converts data in 2-bit parallel, which has been transferred from the memory cell arrays 209' to 212' via the data bus 285, to data in 16-bit parallel.

The data bus 285 between the above first-stage and second-stage parallel-to-serial/serial-to-parallel converting circuits 284 and 286 has the longest bus length in the system.

A description will be given to the operation of the present embodiment in terms of reading out data.

The data in 16-bit parallel read out of each of the memory cell arrays 209' to 212' is amplified by the internal data write/read circuit 282 and transferred to the data bus 283. The first-stage serial-to-parallel/parallel-to-serial converting circuit 284 converts the transferred data in 16-bit parallel to data in 2-bit parallel and transfers it to the second-stage serial-to-parallel/parallel-to-serial converting circuit 286 via the data bus 285. The above second-stage serial-to-parallel/parallel-to-serial converting circuit 286 converts data in 2-bit parallel to data in 1 bit and transfers it to the input/output circuit 288, thus outputting data at high speed.

As described above, the present embodiment is constituted so that the serial-to-parallel/parallel-to-serial converting circuits 284 and 286 are provided in two stages between the memory cell arrays 209' to 212' and the data input/output unit 201'. While data in 16-bit parallel on the data bus 283 is converted to data in 1-bit on the high-speed data bus 287, data in 16-bit parallel is converted to data in 2-bit parallel, thus elongating the data bus 285 in 2-bit parallel, so that data can be transferred at high speed in a small area. If it is assumed that a conversion is to be made directly from data in 16-bit parallel to data in 1 bit, the data bus 283 in 16-bit parallel should be elongated or the high-speed data bus 287 should be elongated. However, the area increases in the case where the data bus 283 in 16-bit parallel is elongated, while a speed margin decreases in the case where the high-speed data bus 287 is elongated. In the present embodiment, however, it is possible to eliminate the above two disadvantages.

In general, the data bus 285 having the longest bus length the present embodiment has a large capacity. In a chip or the like having an input/output unit of multi-bit parallel configuration, in particular, a charging/discharging current flowing along this portion is extremely large, which interferes with lower-power operation. However, since the data bus 285 has a comparatively large speed margin, it can maintain the amplitude level of data on the data bus 285 smaller than the power-source voltage, thereby decreasing the charging/discharging current and performing lower-power operation.

As for the writing operation, since it basically follows the path of the above reading operation in the reverse direction, the description thereof is omitted here.

EIGHTH EMBODIMENT

Figure 22:
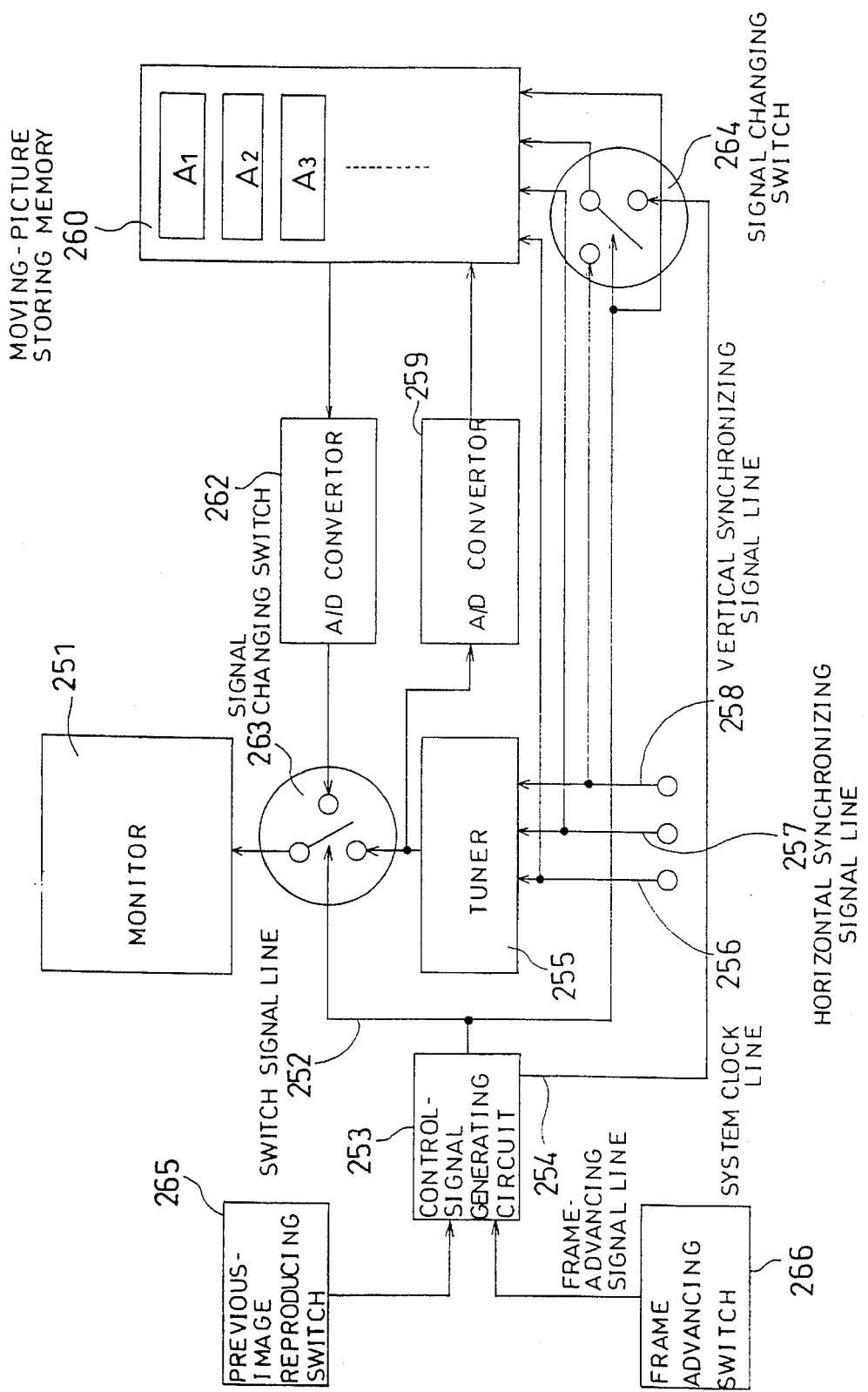
FIG. 22 is a view schematically showing a moving-picture displaying apparatus in an eighth embodiment of the present invention.

FIG. 22 is a schematic view of the moving-picture displaying apparatus according to an eighth embodiment.

In the drawing, a reference numeral 251 designates a monitor, 252 designates a switch signal line, 253 designates a control-signal generating circuit, 254 designates a frame-advancing signal line, 255 designates a tuner, 256 designates a system clock line, 257 designates a horizontal synchronizing signal line, 258 designates a vertical synchronizing signal line, 259 designates an A/D converter, 260 designates a moving-picture storing memory having a plurality of sub-memory-arrays A1, A2, A3, . . . , and An, each for storing data on one frame (one image), 262 designates a D/A converter, 263 designates a signal changing switch (switching means) manually operated by the operator, 264 designates another signal changing switch (another switching means) manually operated by the operator, 265 designates a previous-image reproducing switch, and 266 designates a frame advancing switch manually operated by the operator.

To the above tuner 255 are connected three signal lines which are a system clock line 256, a horizontal synchronizing signal line 257, and a vertical synchronizing signal line 258. Image information is outputted in response to a signal inputted via each of the signal lines.

The above tuner 255 produces two outputs, of which one is inputted to the monitor via the signal changing switch 263 so that a moving picture is displayed on the monitor. The other output is subjected to A/D conversion while passing through the A/D convertor 259, so that data is saved in the moving-picture storing memory 260. The above moving-picture storing memory 260 is the same as those shown in the above fifth and sixth embodiments.

To the moving-picture storing memory 260 are connected three signal lines which are the system clock line 256, horizontal synchronizing signal line 257, and vertical synchronizing signal line 258, similarly to the tuner 255, so that image information is inputted or outputted in response to a signal inputted via each of the signal lines. Although the above moving-picture storing memory 260 is for storing information on a moving picture for a specified period of time, the information stored is updated with the passage of time by rewriting new image information in the memory. That is, information on the oldest frame stored is erased where information on a new frame is written, so that only image information saved between the present time and a specified past time can be stored.

The output from the above moving-picture storing memory 260 is inputted to the monitor 251 via the D/A convertor 262 and signal changing switch 263.

To the moving-picture storing memory 260 is also connected the switch signal line 252. The content of the switch signal line 252 is switched by operating the above previous-image reproducing switch 265 and inputted to the write-control-signal input terminal 216 shown in FIG. 17. The moving-picture storing memory 260 internally controls itself via the switch signal line 252 so that, if the output from the tuner 255 is displayed as it is on the screen of the monitor 251, the data is also written in the moving-picture storing memory 260 and that, if the data in the moving-picture storing memory 260 is displayed on the screen of the monitor 251, the data is not written in the moving-picture storing memory 260.

The above switch signal line 252 is also connected to the signal changing switch 264. The signal changing switch 264 is switched to the vertical synchronizing signal line 258 when the above signal changing switch 263 is switched to the side of the tuner 255, while it is switched to the control-signal generating unit 253 when the signal changing switch 263 is switched to the side of the D/A convertor 262, thereby inputting a signal from the frame-advancing signal line 254 to the moving-picture storing memory 260. In other words, if the output from the tuner 255 is displayed as it is on the screen of the monitor 251, the vertical synchronizing signal of the system is transmitted to the moving-picture storing memory 260. If the data in the moving-picture storing memory 260 is displayed on the screen of the monitor 251, on the other hand, the frame advancing signal is transmitted to the moving-picture storing memory 260.

The frame-advancing signal line 254 of the above control-signal generating unit 253 is for advancing, if a required frame is to be retrieved in the moving-picture storing memory 260, frames asynchronously with the vertical synchronizing signal of the system. The frame advancing signal is generated by operating the above frame advancing switch 266. After the required frame stored in the moving-picture storing memory 260 was retrieved, if the frame advancing switch 266 is not operated and the moving-picture storing memory 260 is isolated from the vertical synchronizing signal 258 by the signal changing switch 264, the frame can be displayed for a long period of time.

With the foregoing moving-picture displaying apparatus, information displayed on the monitor (TV screen) 251 only for a short period of time, such as a destination address for post cards or a recipe in a cooking program, can be displayed for a longer period of time. Therefore, even when the information displayed on the monitor 251 was dismissed in a short period of time, if the user of the moving-picture displaying apparatus immediately switches the signal changing switches 263 and 264 so that the moving picture stored in the moving-picture storing memory 260 is read out, the control-signal generating unit 253 outputs the frame advancing signal 254. Consequently, the required information saved in the moving-picture storing memory 260 can be displayed on the monitor 251. In 5 to 10 seconds, the moving-picture storing memory 260 can obtain a sufficient moving-picture storing capacity for implementing the system.

Figure 23:
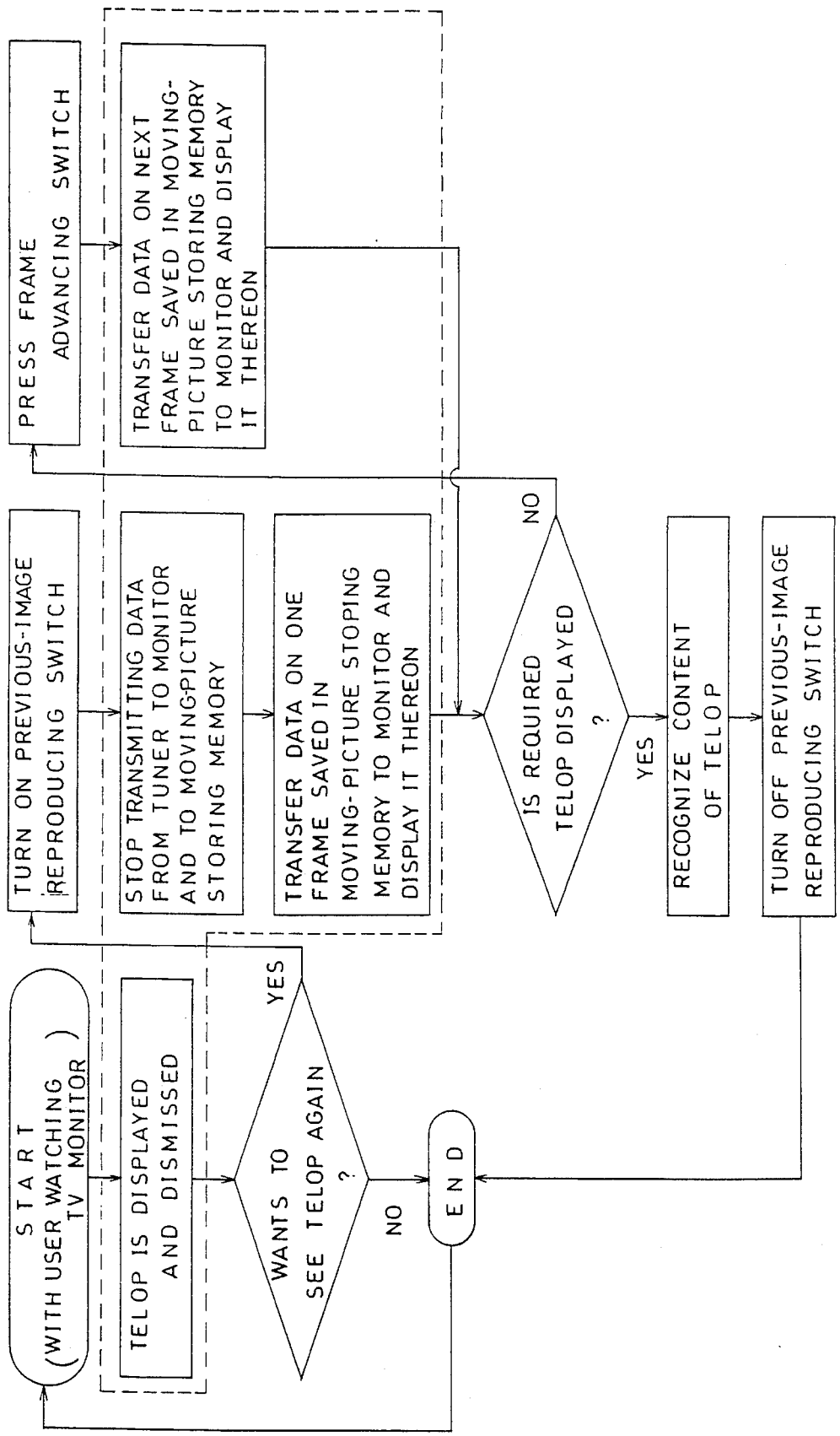
FIG. 23 is a flow chart illustrating the operation of the eighth embodiment according to the present invention.

FIG. 23 shows the flow chart in the case of using the present image-displaying apparatus.

The region inside the dotted enclosure indicates the operation of the present apparatus, while the region outside the dotted enclosure indicates the operation of the user of the present apparatus.

The flow chart starts with the user watching the monitor 251. If the telop being displayed on the monitor 251 disappears and the user wants to see the telop again, he turns the previous-image reproducing switch 265 on so that the control-signal generating unit 253 outputs a switch signal to the switch signal line 252, which halts the data transmission from the tuner 255 to the monitor 251 and to the moving-picture storing memory 260, while connecting the moving-picture storing memory 260 to the monitor 251. Consequently, data on one frame (one image) stored in the moving-picture storing memory 260, e.g., data in the sub-memory-array A1 is transmitted to the monitor 251 and displayed.

If the telop the user wants to see is not displayed, the control-signal generating unit 253 outputs the frame advancing signal to the frame-advancing signal line by repeatedly pressing the frame advancing switch 266, so that data on the subsequent one frame (one image) stored in the moving-picture storing memory 260, e.g., data in the sub-memory-array A2 is transferred to the monitor 251 and displayed thereon. The above procedure is repeatedly performed thereafter.

Although the present apparatus uses only the frame advancing signal, a frame returning signal may be used in addition to the moving-picture storing memory 260. However, the present apparatus does not particularly require the use of a returning signal if it is constituted so that data outputted from the moving-picture storing memory 260 returns to the leading frame thereof as a result of the frame advancing operation.

Thus, with the present apparatus, if the user wants to see again the moving picture that has disappeared from the monitor 151, it is possible for him to see the moving picture, as required, by reproducing the moving picture from data stored in the moving-picture storing memory 260. Unlike the present apparatus, a conventional moving-picture storing device using a magnetic tape or the like is not preferable, in terms of reliability or for other reasons, for the purpose of continuously storing moving pictures. Hence, moving pictures can be stored continuously only with the use of the present moving-picture displaying apparatus.

NINTH EMBODIMENT

Figure 24:
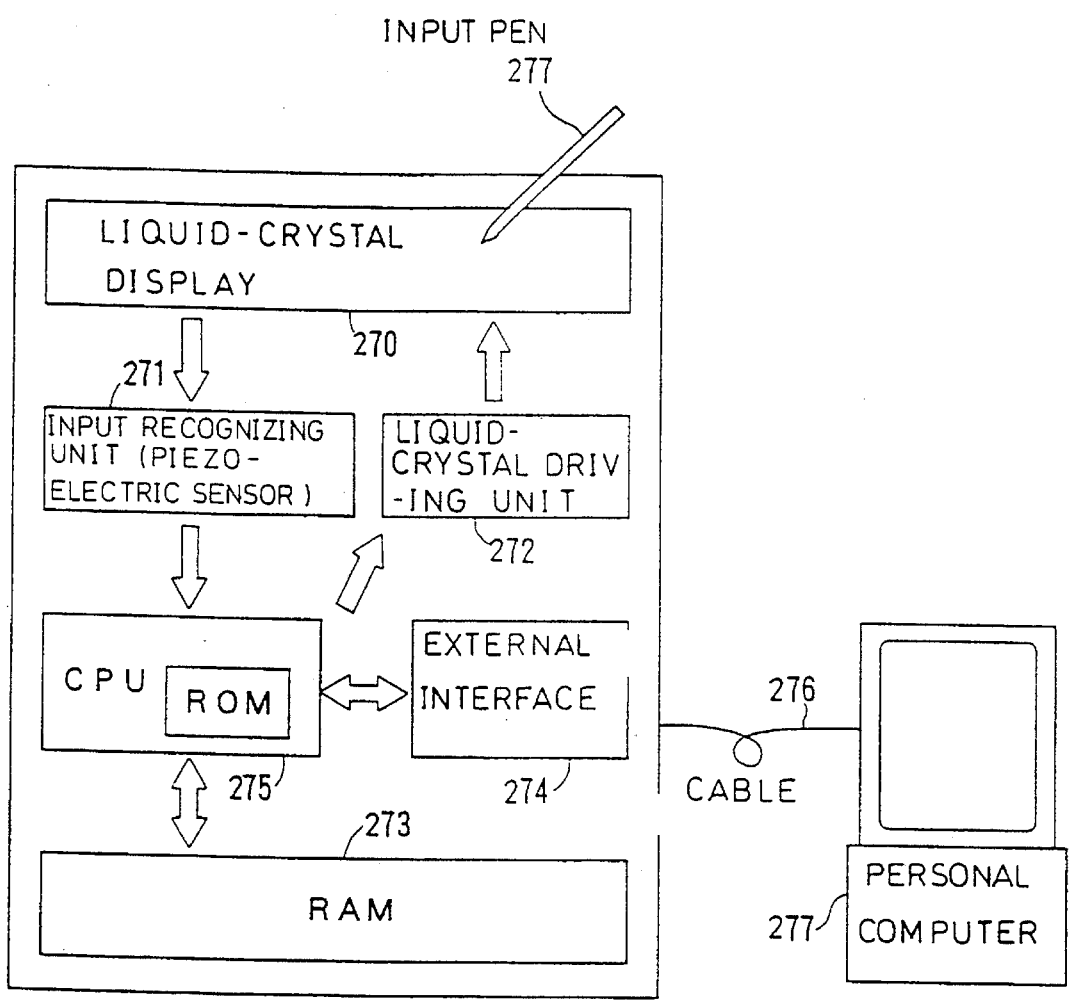
FIG. 24 is a view schematically showing an electronic notebook in a ninth embodiment of the present invention.

FIG. 24 is a view schematically showing the structure of a hand-held electronic notebook according to a ninth embodiment of the present invention.

In the electronic notebook shown in the drawing, a reference numeral 270 designates a liquid-crystal display (display screen) on which data is written with an input pen 277, 271 designates an input recognizing unit composed of a piezoelectric sensor or the like for recognizing data written on the above Liquid-crystal display 270, 272 designates a liquid-crystal driving unit for driving the above liquid-crystal display 270 so that data is displayed thereon, 273 designates a RAM for storing data or the like written on the above liquid-crystal display 270, 274 designates an external interface for giving and receiving data to and from a personal computer 277 connected thereto via a cable 276 or the like, and 275 designates a controller (CPU) internally provided with a ROM.

Figure 25:
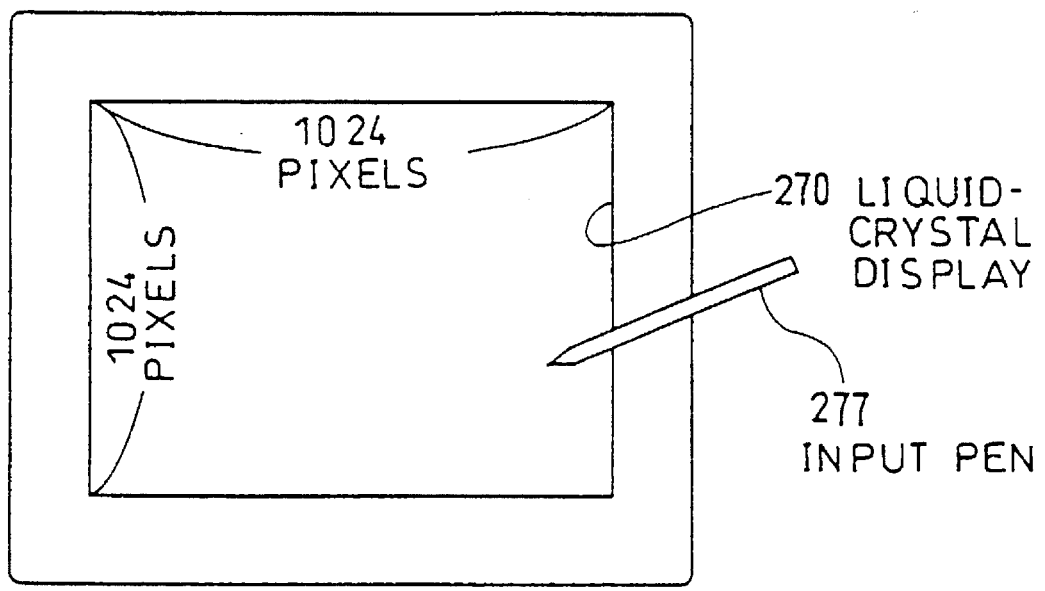
FIG. 25 is a view showing in detail the structure of a liquid-crystal display of the electronic notebook in the ninth embodiment off the present invention.

The above liquid-crystal display 270 has a display screen equal to or larger than International Organization Standardization Size B5 and the number of pixels provided in matrix thereon is, e.g., 1024 by 1024, as shown in FIG. 25.

The above RAM 273 is composed of a DRAM (dynamic RAM) which performs high-speed writing operation, which is internally provided with a large number of cell-array regions (sub-memory-arrays) 273a which were formed by dividing a memory cell array into a plurality of sections each having a capacity of 1M bits, which corresponds to the capacity for one page (one image) of the above liquid-crystal display 270. These cell-array regions 273a store data on 256 pages, if a 256M-bit DRAM is used, which is processed in pages. The cell-array regions 273a have their respective bidirectional shift registers 273b for page selection.

Figure 26:
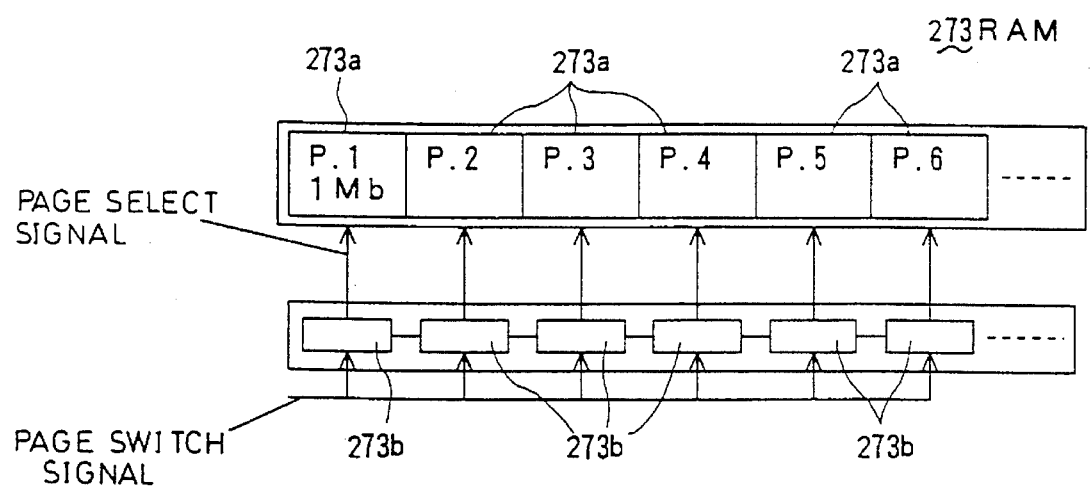
FIG. 26 is a view showing the structure of an internal principal portion of a RAM provided in the electronic notebook of the ninth embodiment according to the present invention.
Figure 27:
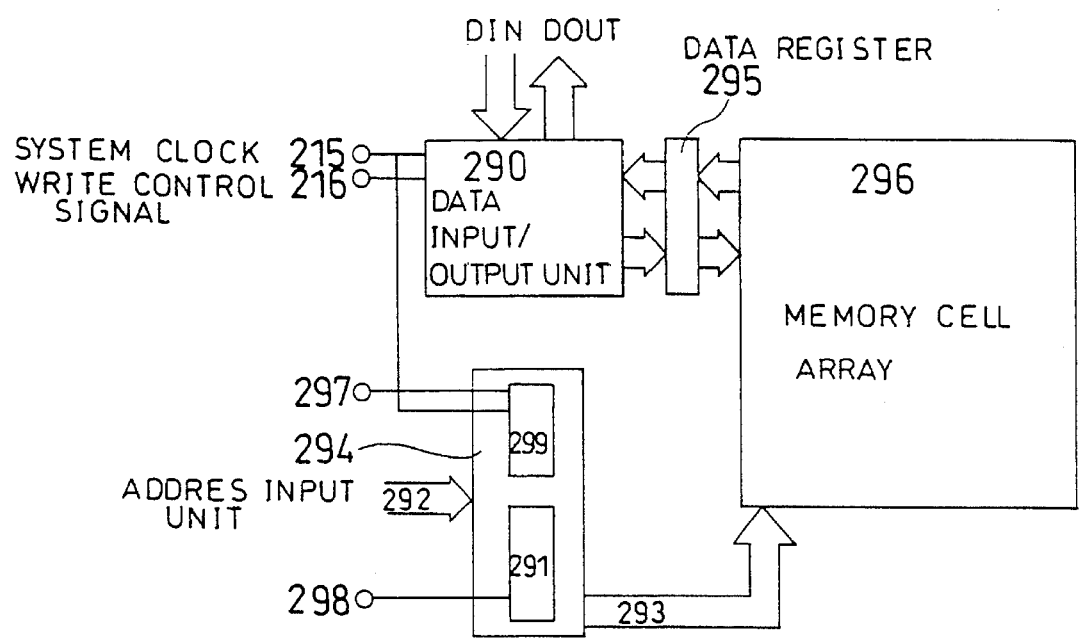
FIG. 27 is a view schematically showing the structure of a conventional moving-picture storing memory.

Moreover, the above RAM 273 receives only the system clock and a page switch signal from the outside, while it generates the column address and row address therein. The above page switch signal is inputted to each of the above shift registers 273b, as shown in FIG. 26, so that a page select signal is outputted from any of the shift registers 273b to the corresponding cell-array region 273a.

The RAM 273 stores data written in pages (in images) on the liquid-crystal display 270 or image data fetched from the external interface 274 in the corresponding cell-array regions 273a without data compression. After the image data fetched from the external interface 274 was temporarily stored in the RAM 273, if it is displayed on the liquid-crystal display 270 on which the operator writes additional data with the input pen 277, image data including the additional data can be stored in each of the cell-array regions 273a. Since data is stored without data compression, the amount of data is not increased.

The data stored in each of the cell-array regions 273a of the above RAM 273 is simultaneously refreshed (all the pages at a time). Consequently, the number of times that peripheral circuitry is operated for performing the refresh operation is reduced, thereby lowering power consumption. Since the RAM 273 is driven with a Low-power battery, it performs low-speed serial operation but, if data is to be transferred to the personal computer 277, the RAM 273 is driven with high voltage by an external power source, so that data is transmitted at high speed.

The above input pen 277 is for promptly inputting a geometric figure or the like via the liquid-crystal display 270. The liquid-crystal display 270 is designed to have a coarse surface so that the tip of the input pen 277 does not slide thereon and a grid of about 5 mm is constantly displayed on the liquid-crystal display 270 as ruled lines for writing data.

The controller 275 is provided with only such primary functions as page-advancing function, line-size changing function, and erasing function for erasing data, and is not provided with additional functions.

Since the RAM 273 of the electronic notebook in the present embodiment, which receives the inputting of data with the pen, is divided into the cell-array regions 273a for storing data on a static picture in images on the liquid-crystal display 270, the images (pages) on the liquid-crystal display 270 can easily be distinguished from each other. Furthermore, since the RAM 273 is used as a data storing element, it is light in weight compared with a hard disk or floppy disk.

We claim:

1. A semiconductor memory to which data can be sequentially inputted/outputted in synchronization with an external clock, comprising:

a plurality of memory arrays disposed on a chip;

a memory-array selecting circuit for selecting, in accordance with a group of addresses inputted from the outside, at least one memory array out of said plurality of memory arrays;

refresh-signal generating means for generating a refresh address and a word-line basic clock for refresh; and address-selecting circuits which are equal in number to said memory arrays so as to correspond to said respective memory arrays, wherein each of said address-selecting circuits is constituted so that it selects, when the corresponding memory array is selected by said memory-array selecting circuit, a word line in said selected memory array in accordance with the group of addresses inputted from the outside and with a word-line basic clock, while it selects, when the corresponding memory array is not selected by said memory-array selecting circuit, word lines in said memory arrays which have not been selected in accordance with the refresh address and the word-line basic clock for refresh generated by said refresh-signal generating means, said semiconductor memory further comprising:

a pre-switching-time predicting circuit for predicting a time point immediately before a predetermined time at which each of the memory arrays is switched from the unselected state to the selected state by said memory-array selecting circuit; and a refresh inhibit circuit for inhibiting said refresh-signal generating means from generating the word-line basic clock for refresh at the time point immediately before the predetermined time which was predicted by said pre-switching-time predicting circuit.

2. A semiconductor memory according to claim 1, wherein the refresh-signal generating means consists of:

a timer circuit for determining a refresh cycle;

a clock generator for generating a clock for self-refresh and the word-line basic clock for refresh during the refresh cycle determined by said timer circuit; and a refresh counter for receiving the clock for self-refresh generated by said clock generator and generating the refresh address.

3. A semiconductor memory according to claim 2, wherein the single timer circuit and the single clock generator are provided in the refresh-signal generating means and the refresh counters, which are equal in number to the plurality of memory arrays, are provided so as to correspond to the respective memory arrays.

4. A semiconductor memory according to claim 1, wherein the pre-switching-time predicting circuit is composed of a counter using the word-line basic clock as a clock for increment and of a counted number detecting circuit for detecting the number counted by said counter and the refresh inhibit circuit is composed of a refresh halt control circuit for inhibiting the refresh-signal generating means from generating the word-line basic clock for refresh by outputting a refresh halt signal to the refresh-signal generating means during the period during which the counted number detected by said counted-number detecting circuit is within the range of a number smaller by a specified value than a predetermined counted number obtained at the time at which the memory array is switched to the selected state to said predetermined counted number.

5. A semiconductor memory according to claim 4, wherein the refresh halt control-circuit outputs the refresh halt signal to the clock generator of the refresh-signal generating means.

6. A semiconductor memory according to claim 1, further comprising:

an access-completion detecting circuit for detecting the completion of access to data on one word line in the memory array selected by the memory-array selecting circuit;

a normal-operation-halt control circuit for halting the selection of the memory array by said memory-array selecting circuit from the time at which said access-completion detecting circuit detected the completion of the access on, so that the address-selecting circuit selects a word line in said memory array in accordance with the refresh address of the refresh-signal generating means; and a cycle setting circuit for setting, when said normal-operation-halt control circuit halted the selection of the memory array, a shorter increment cycle for the refresh address of said refresh-signal generating means.

7. A semiconductor memory according to claim 6, wherein the access-completion detecting circuit is composed of a clock counter which is reset by a basic clock for column for fetching a column address and which is incremented by an external clock having a cycle time shorter than the cycle time of the clock for self-refresh from the refresh-signal generating means and of a counted number detecting circuit for detecting a coincidence of the number counted by said clock counter with the predetermined counted number obtained at the time at which the access to the data on the word line is completed and the cycle setting circuit is composed of a clock selecting circuit for outputting, when the normal-operation-halt control circuit halted the selection of the memory array, a clock of a frequency corresponding to the frequency of said external clock as the clock for increment, in place of the clock for self-refresh from the clock generator.

8. A semiconductor memory according to claim 7, wherein the clock counter is controlled so that it operates when the frequency of the external clock is equal to or lower than a predetermined value and halts the operation when the frequency of the external clock exceeds the predetermined value.

9. A semiconductor memory according to claim 7, wherein the clock selecting circuit outputs, as the clock for increment, the external clock as it is to the refresh counter.

10. A semiconductor memory according to claim 7, further comprising a frequency divider for dividing the frequency of the external clock, wherein the clock selecting circuit outputs, to the refresh counter, a clock of a frequency resulting from the frequency of the external clock divided by the frequency divider as the clock for increment.

11. A semiconductor memory according to claim 1, 4, 6, or 7, further comprising a delay circuit for generating a delayed word-line basic clock for refresh by delaying the word-line basic clock for refresh generated by the refresh-signal generating means by a predetermined period within the increment cycle for the refresh address generated by said refresh-signal generating means, wherein the word-line basic clock for refresh generated by said refresh-signal generating means and the delayed word-line basic clock for refresh generated by said delay circuit are inputted to the address-selecting circuits corresponding to the plurality of memory arrays which have not been selected by the memory-array selecting circuit and the operation of activating and inactivating the word lines for refreshing the plurality of memory arrays which have not been selected by said memory-array selecting circuit is performed at different times for different memory arrays.

12. A semiconductor memory according to claim 11, wherein the delay circuit generates the delayed word-line basic clocks for refresh provided with different delay times, said delayed word-line basic clocks for refresh being equal in number to the memory arrays which have not been selected by the memory-array selecting circuit and the plurality of memory arrays which have not been selected by said memory-array selecting circuit are sequentially refreshed at different times.

13. A semiconductor memory according to claim 12, wherein the delay circuit comprises:

a ring oscillator for receiving the clock for self-refresh and generating, every time the clock for self-refresh is inputted, a clock having a cycle shorter than the cycle of said clock for self-refresh; and shift register circuits having multiple stages equal in number to the memory arrays which have not been selected by the memory-array selecting circuit, wherein the output from said ring oscillator is used as a clock for transfer in each stage of said shift register circuits, the word-line basic clock for refresh from the refresh-signal generating means is inputted to the first stage of said shift register circuits, and the outputs from the individual stages of said shift register circuits are used as the plurality of delayed word-line basic clocks for refresh provided with different delay times.

14. A semiconductor memory according to claim 13, further comprising a delay device for delaying the output from the ring oscillator, wherein the output from said delay device is used as another clock for transfer in each stage of the shift register circuits and each of the delayed word-line basic clocks for refresh is set by the output from said delay device and reset by the output from said ring oscillator.

15. A semiconductor memory according to claim 2, 4, 6, 7, 12, or 13, further comprising a selection detecting circuit for detecting the presence or absence of a memory array selected by the memory-array selecting circuit, wherein the timing period of the timer circuit is set to a predetermined period when said selection detecting circuit detected the state in which none of the memory arrays had been selected, while the timing period of the timer circuit is set to a period shorter than said predetermined period when said selection detecting circuit detected the state in which any of the memory arrays had been selected.

16. A semiconductor memory according to claim 15, wherein the selection detecting circuit is composed of an OR circuit for receiving a memory array select signal outputted from the memory-array selecting circuit and the timer circuit is composed of a first timer circuit for determining a first refresh cycle and of a second timer circuit for determining a second refresh cycle which is shorter than said first refresh cycle, said semiconductor memory further comprising a refresh-cycle selecting circuit for selecting, in accordance with the output from said OR circuit serving as a control signal, said first timer circuit when none of the memory arrays outputting signals at the Low level was selected or said second timer when any of the memory arrays outputting signals at the High level was selected.

17. A semiconductor memory comprising a plurality of memory arrays disposed on a chip, wherein a normal read/write operation is performed with respect to a selected memory array at the same time that a refresh operation is performed with respect to the memory arrays which have not been selected said semiconductor memory further comprising:

a selection detecting circuit for detecting the presence or absence of said selected memory array; and a timer circuit for setting a refresh cycle to a predetermined period when said selection detecting circuit detected the state in which none of the memory arrays had been selected, while setting the refresh cycle to a period shorter than said predetermined period when said selection detecting circuit selected the state in which any of the memory arrays had been selected.

18. A semiconductor memory according to claim 1, wherein each of the plurality of memory arrays disposed serves as a sub-memory-array for storing, of sequential sets of image data, data on one image, said semiconductor memory further comprising additional data input/output means For inputting and outputting data to and from each of said sub-memory-arrays.

* * * * *